(12) United States Patent
Yuasa et al.

(10) Patent No.: US 8,228,643 B2
(45) Date of Patent: Jul. 24, 2012

(54) METHOD FOR MANUFACTURING A MAGNETO-RESISTANCE EFFECT ELEMENT AND MAGNETIC RECORDING AND REPRODUCING APPARATUS

(75) Inventors: Hiromi Yuasa, Kanagawa-ken (JP); Hideaki Fukuzawa, Kanagawa-ken (JP); Yoshihiko Fuji, Kanagawa-ken (JP); Shuichi Murakami, Tokyo (JP); Michiko Hara, Kanagawa-ken (JP); Kunliang Zhang, Fremont, CA (US); Min Li, Dublin, CA (US); Erhard Schreck, San Jose, CA (US)

(73) Assignees: Kabushiki Kaisha Toshiba, Tokyo (JP); TDK Corporation, Tokyo (JP)

( * ) Notice: Subject to any disclaimer, the term of this patent is extended or adjusted under 35 U.S.C. 154(b) by 383 days.

(21) Appl. No.: 12/585,854

(22) Filed: Sep. 25, 2009

(65) Prior Publication Data
US 2010/0091415 A1    Apr. 15, 2010

(30) Foreign Application Priority Data
Sep. 26, 2008    (JP) ................................ 2008-249223

(51) Int. Cl.
*G11B 5/39* (2006.01)
(52) U.S. Cl. ...................................... 360/324
(58) Field of Classification Search .................. 360/324
See application file for complete search history.

(56) References Cited

U.S. PATENT DOCUMENTS

| | | | |
|---|---|---|---|
| 3,775,328 A | 11/1973 | Denes | |
| 4,650,708 A | 3/1987 | Takahashi | |
| 5,116,782 A | 5/1992 | Yamaguchi et al. | |
| 5,139,376 A | 8/1992 | Pumphrey | |
| 5,206,590 A | 4/1993 | Dieny et al. | |
| 5,257,531 A | 11/1993 | Motosugi | |
| 5,287,238 A | 2/1994 | Baumgart et al. | |
| 5,304,975 A | 4/1994 | Saito et al. | |
| 5,313,186 A | 5/1994 | Schuhl et al. | |
| 5,448,515 A | 9/1995 | Fukami et al. | |

(Continued)

FOREIGN PATENT DOCUMENTS
CN    1431651    7/2003
(Continued)

OTHER PUBLICATIONS

A. Losev et al., "Electron Beam Induced Reduction Ofof CuO in the Presence of a Surface Carbonaceous Layer: An XPS/Hreels Study", Surface Science 213 (1989) pp. 554-579.

(Continued)

*Primary Examiner* — Mark Blouin
(74) *Attorney, Agent, or Firm* — Nixon & Vanderhye, P.C.

(57) ABSTRACT

A method for manufacturing a magneto-resistance effect element is provided. The magneto-resistance effect element includes a first magnetic layer including a ferromagnetic material, a second magnetic layer including a ferromagnetic material and a spacer layer provided between the first magnetic layer and the second magnetic layer, the spacer layer having an insulating layer and a conductive portion penetrating through the insulating layer. The method includes: forming a film to be a base material of the spacer layer; performing a first treatment using a gas including at least one of oxygen molecules, oxygen atoms, oxygen ions, oxygen plasma and oxygen radicals on the film; and performing a second treatment using a gas including at least one of nitrogen ions, nitrogen atoms, nitrogen plasma, and nitrogen radicals on the film submitted to the first treatment.

17 Claims, 16 Drawing Sheets

U.S. PATENT DOCUMENTS

| | | | |
|---|---|---|---|
| 5,459,687 A | 10/1995 | Sakakima et al. |
| 5,549,978 A | 8/1996 | Iwasaki et al. |
| 5,576,915 A | 11/1996 | Akiyama et al. |
| 5,599,742 A | 2/1997 | Kadomura |
| 5,653,841 A | 8/1997 | Krishnamurthy |
| 5,668,688 A | 9/1997 | Dykes et al. |
| 5,715,121 A | 2/1998 | Sakakima et al. |
| 5,768,181 A | 6/1998 | Zhu et al. |
| 5,768,183 A | 6/1998 | Zhu et al. |
| 5,777,542 A | 7/1998 | Ohsawa et al. |
| 5,885,750 A | 3/1999 | Hsiao |
| 5,900,324 A | 5/1999 | Moroisha et al. |
| 5,923,504 A | 7/1999 | Araki et al. |
| 5,936,402 A | 8/1999 | Schep et al. |
| 5,949,622 A | 9/1999 | Kamiguchi et al. |
| 5,962,080 A | 10/1999 | Tan et al. |
| 6,002,553 A | 12/1999 | Stearns et al. |
| 6,013,365 A | 1/2000 | Dieny et al. |
| 6,016,241 A | 1/2000 | Coffey et al. |
| 6,025,979 A | 2/2000 | Yamane et al. |
| 6,033,584 A | 3/2000 | Ngo et al. |
| 6,074,743 A | 6/2000 | Araki et al. |
| 6,088,195 A | 7/2000 | Kamiguchi et al. |
| 6,090,498 A | 7/2000 | Omata et al. |
| 6,096,434 A | 8/2000 | Yano et al. |
| 6,111,729 A | 8/2000 | Kamiguchi et al. |
| 6,114,056 A | 9/2000 | Inomata et al. |
| 6,117,569 A | 9/2000 | Lin et al. |
| 6,127,045 A | 10/2000 | Gill |
| 6,132,892 A | 10/2000 | Yoshikawa et al. |
| 6,159,593 A | 12/2000 | Iwasaki et al. |
| 6,205,008 B1 | 3/2001 | Gijs et al. |
| 6,219,275 B1 | 4/2001 | Nishimura |
| 6,221,518 B1 | 4/2001 | Araki et al. |
| 6,254,966 B1 * | 7/2001 | Kondo ........................... 428/156 |
| 6,258,470 B1 | 7/2001 | Sakakima et al. |
| 6,275,363 B1 | 8/2001 | Gill |
| 6,303,218 B1 | 10/2001 | Kamiguchi et al. |
| 6,313,973 B1 | 11/2001 | Fuke et al. |
| 6,330,137 B1 | 12/2001 | Knapp et al. |
| 6,340,533 B1 | 1/2002 | Ueno et al. |
| 6,341,052 B2 | 1/2002 | Hayashi |
| 6,348,274 B1 | 2/2002 | Kamiguchi et al. |
| 6,353,318 B1 | 3/2002 | Sin et al. |
| 6,368,706 B1 | 4/2002 | Iwasaki et al. |
| 6,400,537 B2 | 6/2002 | Sakakima et al. |
| 6,452,763 B1 | 9/2002 | Gill |
| 6,469,926 B1 | 10/2002 | Chen |
| 6,473,275 B1 | 10/2002 | Gill |
| 6,495,275 B2 | 12/2002 | Kamiguchi et al. |
| 6,517,896 B1 | 2/2003 | Horng et al. |
| 6,519,123 B1 | 2/2003 | Sugawara et al. |
| 6,522,507 B1 | 2/2003 | Horng et al. |
| 6,538,921 B2 | 3/2003 | Daughton et al. |
| 6,556,390 B1 | 4/2003 | Mao et al. |
| 6,560,077 B2 | 5/2003 | Fujiwara et al. |
| 6,567,246 B1 | 5/2003 | Sakakima et al. |
| 6,603,642 B1 | 8/2003 | Arki et al. |
| 6,636,391 B2 | 10/2003 | Watanabe et al. |
| 6,674,615 B2 | 1/2004 | Hayashi |
| 6,686,068 B2 | 2/2004 | Carey et al. |
| 6,690,163 B1 | 2/2004 | Hoshiya et al. |
| 6,707,649 B2 | 3/2004 | Hasegawa et al. |
| 6,710,984 B1 | 3/2004 | Yuasa et al. |
| 6,720,036 B2 | 4/2004 | Tsunekawa et al. |
| 6,759,120 B2 | 7/2004 | Jangill et al. |
| 6,767,655 B2 | 7/2004 | Hiramoto et al. |
| 6,770,382 B1 | 8/2004 | Chang et al. |
| 6,828,039 B2 | 12/2004 | Sugawara |
| 6,853,520 B2 | 2/2005 | Fukuzawa et al. |
| 6,882,509 B2 | 4/2005 | Chang et al. |
| 6,903,907 B2 | 6/2005 | Hasegawa |
| 6,905,780 B2 | 6/2005 | Yuasa et al. |
| 6,929,957 B2 | 8/2005 | Min et al. |
| 6,937,446 B2 | 8/2005 | Kamiguchi et al. |
| 6,937,447 B2 | 8/2005 | Okuno et al. |
| 7,002,781 B2 | 2/2006 | Sugawara |
| 7,008,702 B2 | 3/2006 | Fukuzawa et al. |
| 7,038,893 B2 | 5/2006 | Koui et al. |
| 7,046,489 B2 | 5/2006 | Kamiguchi et al. |
| 7,072,153 B2 | 7/2006 | Koui et al. |
| 7,116,529 B2 | 10/2006 | Yoshikawa et al. |
| 7,163,755 B2 | 1/2007 | Hiramoto et al. |
| 7,177,121 B2 | 2/2007 | Kojima et al. |
| 7,196,877 B2 | 3/2007 | Yoshikawa et al. |
| 7,218,484 B2 | 5/2007 | Hashimoto et al. |
| 7,223,485 B2 | 5/2007 | Yuasa et al. |
| 7,240,419 B2 | 7/2007 | Okuno et al. |
| 7,251,110 B2 * | 7/2007 | Lee et al. ................... 360/324.1 |
| 7,265,950 B2 | 9/2007 | Okuno et al. |
| 7,280,323 B2 | 10/2007 | Sato et al. |
| 7,301,733 B1 | 11/2007 | Fukuzawa et al. |
| 7,304,825 B2 | 12/2007 | Funayama et al. |
| 7,331,100 B2 | 2/2008 | Li et al. |
| 7,355,883 B2 | 4/2008 | Okuno et al. |
| 7,372,672 B2 | 5/2008 | Nishiyama |
| 7,379,278 B2 | 5/2008 | Koui et al. |
| 7,390,529 B2 | 6/2008 | Li et al. |
| 7,405,906 B2 | 7/2008 | Funayama et al. |
| 7,453,672 B2 | 11/2008 | Dieny et al. |
| 7,476,414 B2 | 1/2009 | Fukuzawa et al. |
| 7,495,870 B2 | 2/2009 | Yuasa et al. |
| 7,514,117 B2 | 4/2009 | Fukuzawa et al. |
| 7,522,390 B2 | 4/2009 | Yuasa et al. |
| 7,525,776 B2 | 4/2009 | Fukuzawa et al. |
| 7,583,480 B2 | 9/2009 | Sbiaa et al. |
| 7,602,592 B2 | 10/2009 | Fukuzawa et al. |
| 7,610,674 B2 | 11/2009 | Zhang et al. |
| 7,776,387 B2 | 8/2010 | Fuji et al. |
| 7,782,575 B2 | 8/2010 | Tsuchiya et al. |
| 7,785,662 B2 | 8/2010 | Fuji et al. |
| 7,791,843 B2 | 9/2010 | Kamiguchi et al. |
| 7,808,747 B2 | 10/2010 | Fuji et al. |
| 7,810,228 B2 | 10/2010 | Yuasa et al. |
| 7,821,748 B2 | 10/2010 | Fukuzawa et al. |
| 7,842,334 B2 | 11/2010 | Wakui et al. |
| 7,897,201 B2 | 3/2011 | Yuasa et al. |
| 7,978,442 B2 | 7/2011 | Zhang et al. |
| 7,986,498 B2 * | 7/2011 | Wang et al. ................. 360/324.2 |
| 8,031,443 B2 | 10/2011 | Fuke et al. |
| 8,048,492 B2 | 11/2011 | Fukuzawa et al. |
| 8,049,999 B2 | 11/2011 | Fukuzawa et al. |
| 8,111,489 B2 | 2/2012 | Fuji et al. |
| 8,153,188 B2 | 4/2012 | Fukuzawa et al. |
| 2001/0005300 A1 | 6/2001 | Hayashi |
| 2001/0009063 A1 | 7/2001 | Saito et al. |
| 2001/0014000 A1 | 8/2001 | Tanaka et al. |
| 2001/0040781 A1 | 11/2001 | Tanaka et al. |
| 2002/0048127 A1 | 4/2002 | Fukuzawa et al. |
| 2002/0048128 A1 | 4/2002 | Kamiguchi et al. |
| 2002/0051380 A1 | 5/2002 | Kamiguchi et al. |
| 2002/0054461 A1 | 5/2002 | Fujiwara et al. |
| 2002/0058158 A1 | 5/2002 | Odagawa et al. |
| 2002/0073785 A1 | 6/2002 | Prakash et al. |
| 2002/0097536 A1 | 7/2002 | Komuro et al. |
| 2002/0114974 A1 | 8/2002 | Carey et al. |
| 2002/0126428 A1 | 9/2002 | Gill |
| 2002/0135935 A1 | 9/2002 | Covington |
| 2002/0145835 A1 | 10/2002 | Suzuki et al. |
| 2002/0150791 A1 | 10/2002 | Yuasa et al. |
| 2002/0159201 A1 | 10/2002 | Li et al. |
| 2002/0191355 A1 | 12/2002 | Hiramoto et al. |
| 2003/0011463 A1 | 1/2003 | Iwasaki et al. |
| 2003/0026049 A1 | 2/2003 | Gill |
| 2003/0035256 A1 | 2/2003 | Hayashi et al. |
| 2003/0049389 A1 | 3/2003 | Tsunekawa et al. |
| 2003/0053269 A1 | 3/2003 | Nishiyama |
| 2003/0053270 A1 | 3/2003 | Gill |
| 2003/0099868 A1 | 5/2003 | Tanahashi et al. |
| 2003/0104249 A1 | 6/2003 | Okuno et al. |
| 2003/0123200 A1 | 7/2003 | Nagasaka et al. |
| 2003/0128481 A1 | 7/2003 | Seyama et al. |
| 2003/0156360 A1 | 8/2003 | Kawawake et al. |
| 2004/0021990 A1 | 2/2004 | Koui et al. |
| 2004/0042127 A1 | 3/2004 | Hoshiya et al. |
| 2004/0121185 A1 | 6/2004 | Fukuzawa et al. |
| 2004/0137645 A1 | 7/2004 | Hu et al. |

| | | | | | |
|---|---|---|---|---|---|
| 2004/0150922 | A1 | 8/2004 | Kagami et al. | JP | 05-160123 | 6/1993 |
| 2004/0169963 | A1 | 9/2004 | Okuno et al. | JP | 07-022399 | 1/1995 |
| 2004/0201929 | A1 | 10/2004 | Hashimoto et al. | JP | 08-049063 | 2/1996 |
| 2004/0206619 | A1 | 10/2004 | Pinarbasi | JP | 09-116212 | 5/1997 |
| 2004/0246631 | A1 | 12/2004 | Dieny et al. | JP | 09-306733 | 11/1997 |
| 2005/0042478 | A1 | 2/2005 | Okuno et al. | JP | 10-173252 | 6/1998 |
| 2005/0063104 | A1 | 3/2005 | Takagishi et al. | JP | 10-324969 | 12/1998 |
| 2005/0068855 | A1 | 3/2005 | Morikawa et al. | JP | 11-121832 | 4/1999 |
| 2005/0073778 | A1 | 4/2005 | Hasegawa et al. | JP | 11-154609 | 6/1999 |
| 2005/0094317 | A1 | 5/2005 | Funayama | JP | 11-238923 | 8/1999 |
| 2005/0094322 | A1 | 5/2005 | Fukuzawa et al. | JP | 11-510911 | 9/1999 |
| 2005/0094327 | A1 | 5/2005 | Okuno et al. | JP | 11-293481 | 10/1999 |
| 2005/0141148 | A1 | 6/2005 | Aikawa et al. | JP | 11-296820 | 10/1999 |
| 2005/0168887 | A1 | 8/2005 | Yuasa et al. | JP | 2000-137906 | 5/2000 |
| 2005/0276998 | A1 | 12/2005 | Sato | JP | 2000-156530 | 6/2000 |
| 2006/0002184 | A1 | 1/2006 | Hong et al. | JP | 2000-188435 | 7/2000 |
| 2006/0018057 | A1 | 1/2006 | Huai | JP | 2000-215414 | 8/2000 |
| 2006/0034022 | A1 | 2/2006 | Fukuzawa et al. | JP | 2000-228004 | 8/2000 |
| 2006/0050444 | A1 | 3/2006 | Fukuzawa et al. | JP | 2000-293982 | 10/2000 |
| 2006/0077596 | A1 | 4/2006 | Yuasa et al. | JP | 2001-094173 | 4/2001 |
| 2006/0098353 | A1 | 5/2006 | Fukuzawa et al. | JP | 2001-143227 | 5/2001 |
| 2006/0114620 | A1 | 6/2006 | Sbiaa et al. | JP | 2001-176027 | 6/2001 |
| 2006/0164764 | A1 | 7/2006 | Kamiguichi et al. | JP | 2001-229511 | 8/2001 |
| 2006/0188750 | A1 | 8/2006 | Ide et al. | JP | 2001-237471 | 8/2001 |
| 2007/0070556 | A1 | 3/2007 | Zhang et al. | JP | 2001-358380 | 12/2001 |
| 2007/0081276 | A1 | 4/2007 | Fukuzawa et al. | JP | 2002-076473 | 3/2002 |
| 2007/0091511 | A1 | 4/2007 | Hoshiya et al. | JP | 2002-124721 | 4/2002 |
| 2007/0092639 | A1 | 4/2007 | Fuji et al. | JP | 2002-150512 | 5/2002 |
| 2007/0159733 | A1 | 7/2007 | Hashimoto et al. | JP | 2002-204010 | 7/2002 |
| 2007/0172690 | A1 | 7/2007 | Kim et al. | JP | 2002-208744 | 7/2002 |
| 2007/0188936 | A1 | 8/2007 | Zhang et al. | JP | 2003-086866 | 3/2003 |
| 2007/0188937 | A1 | 8/2007 | Carey et al. | JP | 2003-110168 | 4/2003 |
| 2007/0202249 | A1 | 8/2007 | Yuasa et al. | JP | 2003-152243 | 5/2003 |
| 2007/0223150 | A1 | 9/2007 | Fukuzawa et al. | JP | 2003-204095 | 7/2003 |
| 2007/0253122 | A1 | 11/2007 | Fukuzawa et al. | JP | 2004-006589 | 1/2004 |
| 2007/0259213 | A1 | 11/2007 | Hashimoto et al. | JP | 2004-153248 | 5/2004 |
| 2008/0005891 | A1 | 1/2008 | Yuasa et al. | JP | 2004-214234 | 7/2004 |
| 2008/0008909 | A1 | 1/2008 | Fuji et al. | JP | 2005-097693 | 4/2005 |
| 2008/0013218 | A1 | 1/2008 | Fuke et al. | JP | 2005-136309 | 5/2005 |
| 2008/0062577 | A1 | 3/2008 | Fukuzawa et al. | JP | 2005-166896 | 6/2005 |
| 2008/0068764 | A1 | 3/2008 | Fukuzawa et al. | JP | 2005-191101 | 7/2005 |
| 2008/0080098 | A1 | 4/2008 | Fuke et al. | JP | 2005-285936 | 10/2005 |
| 2008/0102315 | A1 | 5/2008 | Fukuzawa et al. | JP | 2005-339784 | 12/2005 |
| 2008/0106826 | A1 | 5/2008 | Funayama et al. | JP | 2005-353236 | 12/2005 |
| 2008/0192388 | A1 | 8/2008 | Zhang et al. | JP | 2006-019743 | 1/2006 |
| 2008/0204944 | A1 | 8/2008 | Aikawa et al. | JP | 2006-041266 | 2/2006 |
| 2008/0239590 | A1 | 10/2008 | Fuke et al. | JP | 2006-049426 | 2/2006 |
| 2008/0278864 | A1 | 11/2008 | Zhang et al. | JP | 2006-054257 | 2/2006 |
| 2008/0311431 | A1 | 12/2008 | Fuji et al. | JP | 2006-114610 | 4/2006 |
| 2009/0059441 | A1 | 3/2009 | Zhang et al. | JP | 2006-135253 | 5/2006 |
| 2009/0061105 | A1 | 3/2009 | Fukuzawa et al. | JP | 2006-319343 | 11/2006 |
| 2009/0091864 | A1 | 4/2009 | Carey et al. | JP | 2007-115960 | 5/2007 |
| 2009/0091865 | A1 | 4/2009 | Zhang et al. | JP | 2007-221135 | 8/2007 |
| 2009/0104475 | A1 | 4/2009 | Fuji et al. | JP | 2007-266122 | 10/2007 |
| 2009/0109581 | A1 | 4/2009 | Fukuzawa et al. | JP | 2008-016740 | 1/2008 |
| 2009/0141408 | A1 | 6/2009 | Fukuzawa et al. | JP | 2008-016741 | 1/2008 |
| 2009/0162698 | A1 | 6/2009 | Fukuzawa et al. | JP | 2008-199026 | 8/2008 |
| 2009/0225477 | A1 | 9/2009 | Fukuzawa et al. | KR | 10-0302029 | 6/2001 |
| 2009/0314740 | A1 | 12/2009 | Ikemoto et al. | KR | 2001-0081971 | 8/2001 |
| 2010/0037453 | A1 | 2/2010 | Zhang et al. | KR | 2002-0015295 | 2/2002 |
| 2010/0091412 | A1 | 4/2010 | Yuasa et al. | KR | 10-2005-0027159 | 3/2005 |
| 2010/0091414 | A1 | 4/2010 | Yuasa et al. | KR | 10-2005-0118649 | 12/2005 |
| 2010/0091415 | A1 | 4/2010 | Yuasa et al. | KR | 10-2006-0050327 | 5/2006 |
| 2010/0092803 | A1 | 4/2010 | Yuasa et al. | WO | 97-47982 | 12/1997 |
| 2010/0323104 | A1 | 12/2010 | Yuasa et al. | WO | 03/032338 | 4/2003 |
| | | | | WO | 2008/032745 | 3/2008 |

FOREIGN PATENT DOCUMENTS

| | | |
|---|---|---|
| CN | 1183517 | 1/2005 |
| CN | 1746980 | 3/2006 |
| EP | 0 687 917 | 12/1995 |
| EP | 0 877 398 | 11/1998 |
| EP | 1 328 027 | 7/2003 |
| EP | 1 400 957 | 3/2004 |
| EP | 1 548 762 | 6/2005 |
| EP | 1 607 941 | 12/2005 |
| EP | 1 626 393 | 2/2006 |
| GB | 2 390 168 | 12/2003 |
| JP | 60-098518 | 6/1985 |
| JP | 02-173278 | 7/1990 |

OTHER PUBLICATIONS

K.S. Kim et al., "X-Ray Photoelectron Spectroscopic Studies of Nickel-Oxygen Surfaces Using Oxygen and Argon Ion-Bombardment", Surface Science 43 (1974), pp. 625-643.

W.F. Egelhoff, et al., "Oxygen as a Surfactant in the Growth of Giant Magnetoresistance Spin Valves", J Appl. Phys., vol. 82, No. 12, pp. 6142-6151, Dec. 15, 1997.

Y. Kamiguchi et al., "CoFe Specular Spin Valves With a Nano Oxide Layer", The 1999 IEEE International Magnetics Conference, May 18-21, 1999.

H.A. Ferrera et al. "Rapid DNA hybridization based on ac field focusing of magnetically labeled target DNA"; Applied Physics Letters, 87, 013901 (2005); pp. 013901-1 to 013901-3.

L. Lagae et al. "Magnetic biosensors for genetic screening of cystic fibrosis"; IEE Proc. Circuits Devices Syst. vol. 152, No. 4, Aug. 2005, pp. 393-400.

Meguro, K., Hoshiya, H., Watanabe, K., Hamakawa, Y., and Fuyama, M., "Spin-valve films using syntehtic ferrimagnets for pinned layer," (IEEE Trans. Mag., 35(5), 1999, 2925-2927. (Abstract).

C. Vouille et al, J.Appl.Phys. 81 4573 (1997); "Inverse CPP-GMR in (A/Cu/Co/Cu) multilayers . . . by impurities" (Abstract).

A.C. Reilly et al, J.Magn. Magn. Mater, 195 (1999) L269; "Perpendicular giant magnetoresistance of . . . unified picture." (Abstract).

J. Bass et al, J. Magn. Magn. Mater, 200 (1999) 274; "Current-perpendicular (CPP) magnetoresistance in magnetic metallic multilayers." (Abstract).

L. Villa, et al., Journal of Applied Physics, vol. 87, No. 12, pp. 8610-8614, Current Perpendicular Magnetoresistances of NiFeCo and NiFe "Permalloys", Jun. 15, 2000. (Abstract).

Yonsei University Master Thesis, "Voltage Difference Amplification Circuit for Improving the Sensing Characteristics of MRAM", Dec. 2005 and brief English-language translation thereof.

Ceramist vol. 4 No. 5, Special Edition, "Magnetic Sensor Technologies and Applications Using Giant Magnetoresistance effect", Oct. 2001.

Seoul University Doctoral Thesis, A Study on the Development of New Spin Wave Structures for Magnetoresistive RAM based on Giant Magnetoresistance and Tunneling, Aug. 2001 and brief English-language translation thereof.

Nagasaka et al., "Giant magnetoresistance properties of specular spin valve films in a current perpendicular to plane structure," J. Appl. Phys., vol. 89, No. 11, pp. 6943-4965.

Mazin, "How to Define and Calculate the Degree of Spin Polarization in Ferromagnets", Physical Review Letters, vol. 83, No. 7, Aug. 16, 1999, pp. 1427-1430.

Fukuzawa et al., U.S. Appl. No. 11/001,174, filed Dec. 2, 2004.
Fukuzawa et al., U.S. Appl. No. 11/199,448, filed Aug. 9, 2005.
Fuji et al., U.S. Appl. No. 11/583,968, filed Oct. 20, 2006.
Yuasa et al., U.S. Appl. No. 11/703,830, filed Feb. 8, 2007.
Fukuzawa et al., U.S. Appl. No. 11/783,011, filed Apr. 5, 2007.
Fuji et al., U.S. Appl. No. 11/802,474, filed May 23, 2007.
Fuke et al., U.S. Appl. No. 11/822,700, filed Jul. 9, 2007.
Fuke et al., U.S. Appl. No. 11/892,890, filed Aug. 28, 2007.
Zhang et al., U.S. Appl. No. 11/906,716, filed Oct. 3, 2007.
Fuke et al., U.S. Appl. No. 12/071,589, filed Feb. 22, 2008.
Fukuzawa et al., U.S. Appl. No. 12/086,761, filed Jun. 19, 2008.
Fukuzawa et al., U.S. Appl. No. 12/248,578, filed Oct. 9, 2008.
Fuji et al., U.S. Appl. No. 12/314,811, filed Dec. 17, 2008.
Fukuzawa et al., U.S. Appl. No. 12/347,543, filed Dec. 31, 2008.
Yuasa et al., U.S. Appl. No. 12/585,851, filed Sep. 25, 2009.
Yuasa et al., U.S. Appl. No. 12/585,852, filed Sep. 25, 2009.
Yuasa et al., U.S. Appl. No. 12/585,855, filed Sep. 25, 2009.

S. Sanvito, et al. "Breakdown of the Resistor Model of CPP-GMR in Magnetic Multilayered Nanostructures", Physical Review B, vol. 61, No. 20, May 15, 2000, pp. 14225-14228. (Abstract).

Didier Bozec, et al., "Mean Free Path Effects on the Current Perpendicular to the Plane Magnetoresistance of Magnetic Multilayers", Physical Review Letters, vol. 85, No. 6, Aug. 7, 2000, pp. 1314-1317. (Abstract).

B. Dieny, et al., "Magnetotransport Properties of Magnetically Soft Spin-Valve Structures (Invited)", J. Appl. Phys., vol. 69 (8), Apr. 15, 1991, pp. 4774-4779.

B. Dieny et al., "Giant Magnetoresistance of Magentically Soft Sandwiches: Dependence on Temperature and on Layer Thicknesses", Physical Review B, vol. 45, No. 2, Jan. 1, 1992, pp. 806-813.

D. Bozec, et al., "Comparative Study of the Magnetoresistance of MBE-Grown Multilayers: [Fe/Cu/Co/Cu]$_N$ and [Fe/Cu]$_N$[Co/Cu]$_N$ "Physical Review B, vol. 60, No. 5, Aug. 1, 1999, pp. 3037-3039. (Abstract).

Hideaki Fukuzawa, et al., "MR Ratio Enhancement by NOL Current-Confined-Path Structures in CPP Spin Valves", IEEE Transactions on Magnetics, Jul. 2004, vol. 40, No. 4, pp. 2236-2238.

Takagishi, M. et al., "The Applicability of CPP-GMR Heads for Magnetic Recording", IEEE Transactions on Magnetics, vol. 38, No. 5, pp. 2277-2282, (Sep. 2002).

N. Garcia, et al. "Magnetoresistance in Excess of 200% in Ballistic Ni Nanocontacts at Room Temperature and 100 Oe," Physical Review Letters, vol. 82, No. 14, Apr. 5, 1999, pp. 2923-2926. (Abstract).

J.J. Versluijs, et al., "Magnetoresistance of Half-Metallic Oxide Nanocontracts," Physical Review Letters, vol. 87, No. 2, Jul. 9, 2001, pp. 026601-1 through 026601-4.

Machine translation of JP 2002-208744.

Office Action dated Feb. 23, 2012 in counterpart JP Application No. 2008-249223 and English-language translation thereof.

* cited by examiner

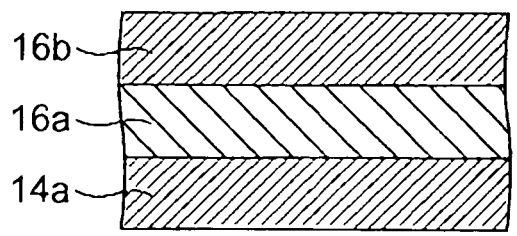
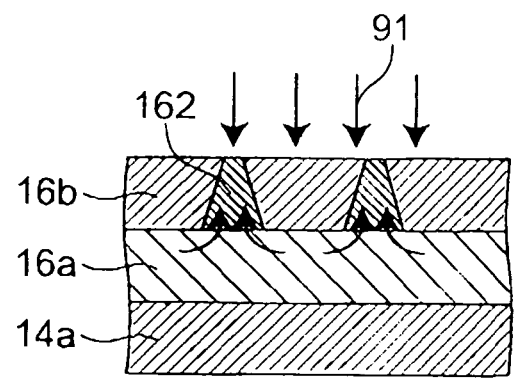
FIG. 4A
FIG. 4B
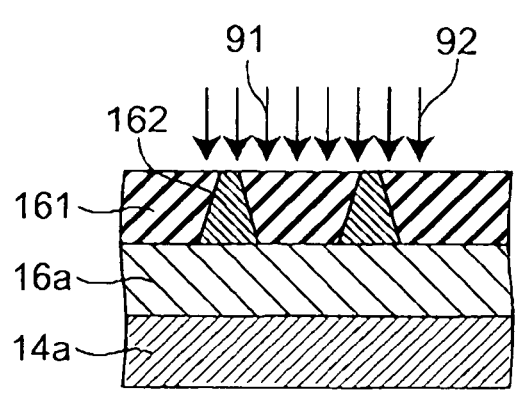
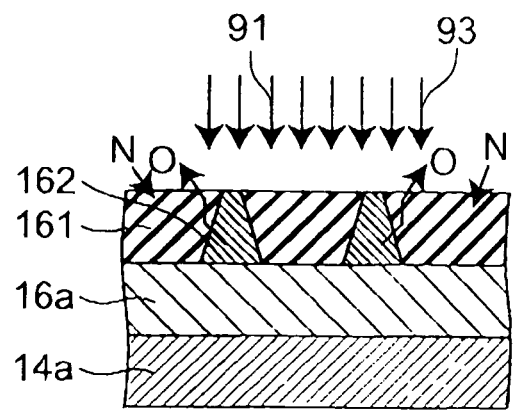
FIG. 4C
FIG. 4D

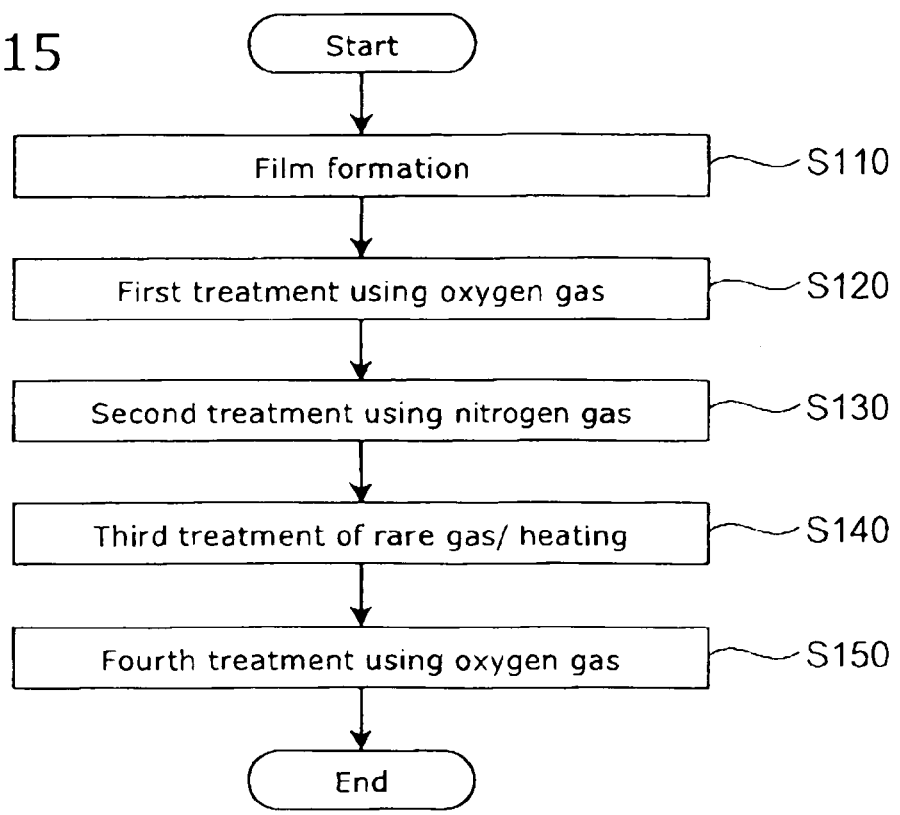
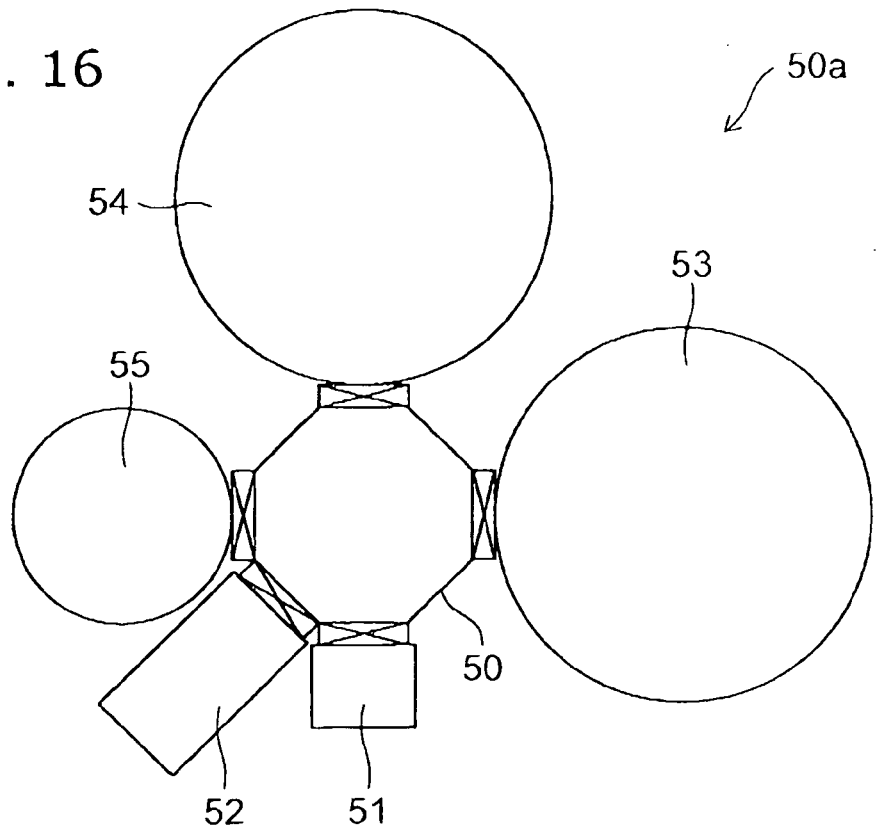

METHOD FOR MANUFACTURING A MAGNETO-RESISTANCE EFFECT ELEMENT AND MAGNETIC RECORDING AND REPRODUCING APPARATUS

CROSS-REFERENCE TO RELATED APPLICATIONS

This application is based upon and claims the benefit of priority from the prior Japanese Patent Application No. 2008-249223, filed on Sep. 26, 2008; the entire contents of which are incorporated herein by reference.

BACKGROUND OF THE INVENTION

1. Field of the Invention

This invention relates to a method for manufacturing a magneto-resistance effect element and a magnetic recording and reproducing apparatus.

2. Background Art

Performance of a magnetic device, particularly such as a magnetic head is extremely enhanced by using Giant Magneto-Resistive Effect (GMR). Particularly, since a spin valve film (SV film) can exhibit a larger GMR effect, the SV film has developed the magnetic device such as a magnetic head and MRAM (Magnetic Random Access Memory).

The "spin valve" film is laminated films having such a structure as sandwiching a non-magnetic metal spacer layer between two ferromagnetic layers and is called as spin depending scattering unit. In the spin valve film, the magnetization of one ferromagnetic layer (often called as a "pinning layer" or "fixed magnetization layer") is fixed by the magnetization of an anti-ferromagnetic layer and the magnetization of the other ferromagnetic layer (often called as a "free layer" or "free magnetization layer") can be rotated in accordance with an external magnetic field. In the spin valve film, an electric resistance changes by varying a relative angle between the magnetizations of the pinning layer and the free layer. The value of the change in the electric resistance is called as MR (Magneto Resistance) variation ratio, and corresponds to an output of the element.

As a magneto-resistance effect element using the spin valve film, a CIP (Current In plane)-GMR element, a TMR (Tunneling Magneto Resistance) element and a CPP (Current Perpendicular to Plane)-GMR element are proposed. Among these elements, the CIP element was put to first practical use. In the CIP-GMR element, a sense current is flowed to the SV film in the direction parallel to the film surface thereof and it was in practice use during a period with a large head size. However, when a head size becomes small with increasing of the recording density in a HDD, a heat or the like become problem and the TMR element, in which a sense current is flowed to the film in the direction perpendicular to the film surface thereof was put to practical use next. In the TMR element has a merit of a small sense current and large output. However, the resistance in the TMR element is usually high because it uses a tunneling current through an insulating barrier. It will become problem not to decrease the resistance of the element in future when the recording density is increased and the head size is downsized.

To solve this problem, the CPP-GMR element has been proposed. The resistance of the element in the CPP-GMR element is low by nature, because it uses a magneto-resistance effect by a metal conduction. This is the merit of the CPP-GMR element comparing with the TMR element.

In a metallic CPP-GMR element in which the SV film is made of metallic films, the variation degree in resistance by the magnetization of the SV film becomes small so that to convert a weak magnetic field (for example, from a magnetic disk of high recording density) to an electric signal becomes difficult.

In contrast, such a CPP element using an oxide layer with a conductive portion along with the direction of film thickness (NOL: Nano-oxide layer) is proposed in JP-A 2002-208744 (KOKAI) (Patent document 1). In the CPP element, the element resistance and the MR variation degree of the element can be developed by means of CCP (Current-confined-path) effect. Hereinafter, this element is often called as a "CCP-CPP element".

However, it is anticipated that from now, applications of magnetic recording devices will be further enlarged and higher-density recording will be achieved, and in this case, it becomes necessary to provide a magneto-resistance effect element having further higher output.

In the case of CCP-CPP element, because current is confined in a spacer, contribution of electric conduction in the conductive portion to GMR effect is very large. Specifically, it has been reported that a MR variation ratio becomes higher as decreasing the electric resistance of the conductive portion in IEEE Trans. Magn. 40 p. 2236, (2004) (Non-patent document 1).

As a means for realizing the CCP-CPP element, a method for manufacturing a spacer has been proposed in JP-A 2006-54257 (Kokai) (Patent document 2).

However, for achieving the MR variation ratio anticipated to be required in the future, further ingenuity is required. That is, it is desired to develop technologies to improve the conductivity of the conductive portion further and improve the MR variation ratio while maintaining the insulating characteristics of the insulating layer.

As a means for decreasing the electric resistance of the conductive portion, there is a method to decreasing further an amount of impurities included in non-magnetic metal forming the conductive portion. Among impurities, by decreasing oxygen impurities, the electric resistance can be decreased. For decreasing the amount of the oxygen impurities, it is effective to reduce the conductive portion. For a reduction effect by a gas in the vacuum chamber, for example, in copper wiring used in a semiconductor device or the like, a technique of removing copper oxide by treatment with hydrogen plasma is known in U.S. Pat. No. 6,033,584 (Patent document 3).

SUMMARY OF THE INVENTION

According to an aspect of the invention, there is provided a method for manufacturing a magneto-resistance effect element having a first magnetic layer including a ferromagnetic material, a second magnetic layer including a ferromagnetic material and a spacer layer provided between the first magnetic layer and the second magnetic layer, the spacer layer having an insulating layer and a conductive portion penetrating through the insulating layer, the method including: forming a film to be a base material of the spacer layer; performing a first treatment using a gas including at least one of oxygen molecules, oxygen atoms, oxygen ions, oxygen plasma and oxygen radicals on the film; and performing a second treatment using a gas including at least one of nitrogen ions, nitrogen atoms, nitrogen plasma, and nitrogen radicals on the film submitted to the first treatment.

According to another aspect of the invention, there is provided a magnetic recording and reproducing apparatus including: a magnetic head assembly including a suspension, a the magneto-resistance effect element being mounted on one end of the suspension, and an actuator arm connected to other end of the suspension; and a magnetic recording medium, information being recorded in the magnetic recording medium by using the magneto-resistance effect element, the magneto-resistance effect element having a first magnetic layer including a ferromagnetic material, a second magnetic layer including a ferromagnetic material and a spacer layer provided between the first magnetic layer and the second magnetic layer, the spacer layer having an insulating layer and a conductive portion penetrating through the insulating layer, the magneto-resistance effect device being manufactured by a method including: forming a film to be a base material of the spacer layer; performing a first treatment using a gas including at least one of oxygen molecules, oxygen atoms, oxygen ions, oxygen plasma and oxygen radicals on the film; and performing a second treatment using a gas including at least one of nitrogen ions, nitrogen atoms, nitrogen plasma, and nitrogen radicals on the film submitted to the first treatment.

BRIEF DESCRIPTION OF THE DRAWINGS

FIGS. 4A to 4D are schematic sectional views illustrating the method for manufacturing according to a first embodiment of this invention;

FIG. 15 is a flow chart illustrating another method for manufacturing according to the second embodiment of this invention;

FIG. 16 is a schematic view illustrating a configuration of a manufacturing apparatus used for the method for manufacturing according to the embodiments of this invention;

DETAILED DESCRIPTION OF THE INVENTION

Hereinafter, each of embodiments of this invention will now be described with reference to drawings.

The drawings are schematic or conceptual. And, the relationships between the thickness and width of each of components, specific coefficient of scales among members, and so forth are not necessarily the same as the actual ones. Moreover, even when the same portions are shown, the scales or specific coefficients are occasionally shown to be different from each other among the drawings.

Moreover, in the specification and each of the drawings, the same signs will be appended to the same components as described with respect to a previously presented drawing, and the detailed description thereof will be appropriately omitted.

First Embodiment

Figure 1:
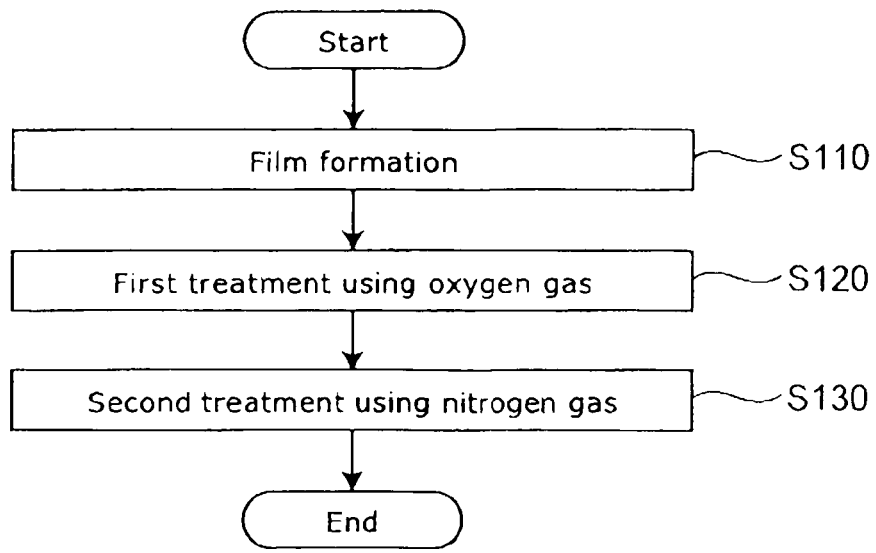
FIG. 1 is a flow chart illustrating a method for manufacturing a magneto-resistance effect element according to a first embodiment of this invention.

FIG. 1 is a flow chart illustrating a method for manufacturing a magneto-resistance effect element according to a first embodiment of this invention.

Figure 2:
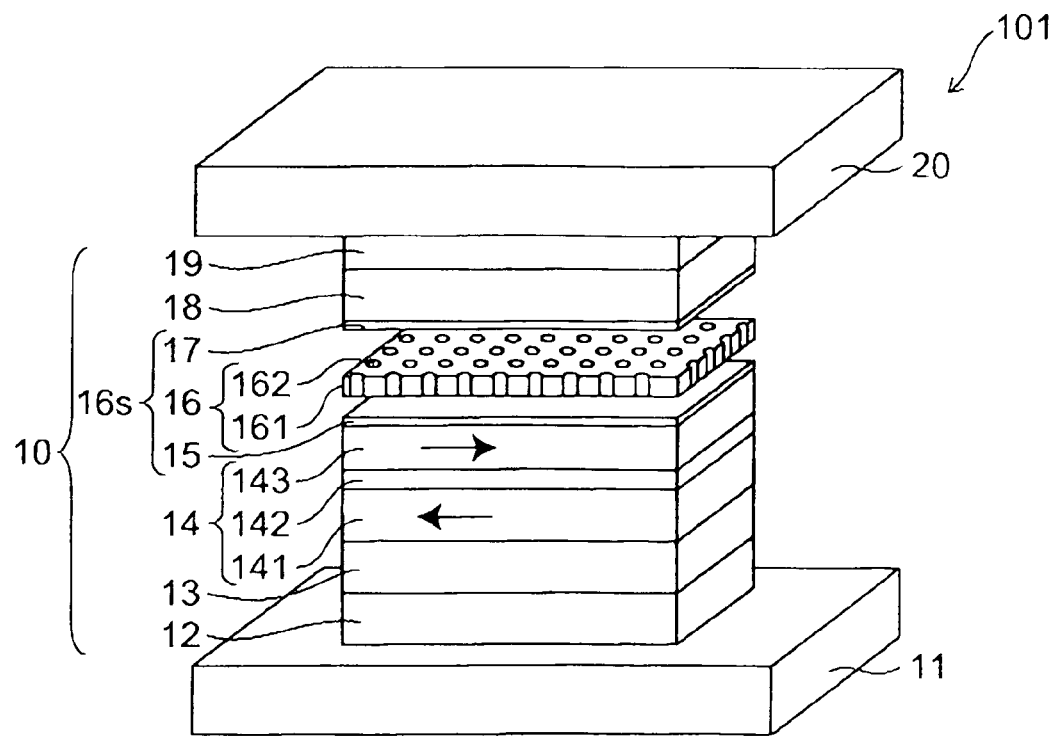
FIG. 2 is a schematic perspective view illustrating a configuration of a magneto-resistance effect element to which the method for manufacturing according to a first embodiment is applied.

FIG. 2 is a schematic perspective view illustrating a configuration of a magneto-resistance effect element to which the method for manufacturing a magneto-resistance effect element according to a first embodiment of this invention is applied.

Figure 3:
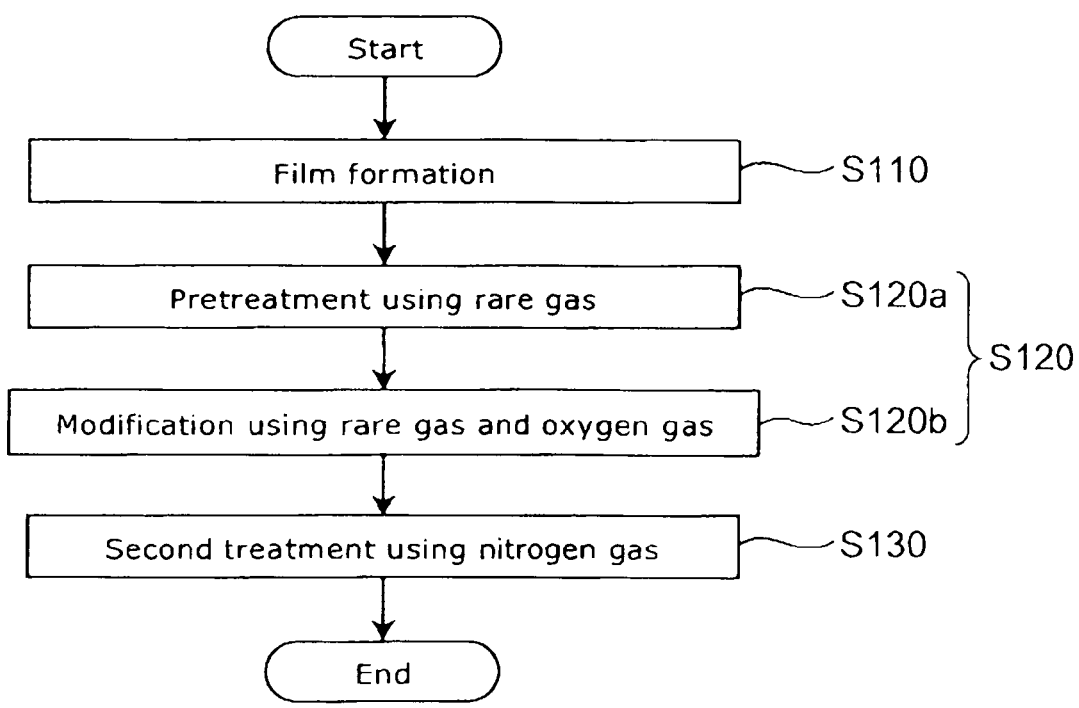
FIG. 3 is a flow chart illustrating a specific example of the method for manufacturing according to a first embodiment of this invention.

FIG. 3 is a flow chart illustrating a specific example of the method for manufacturing a magneto-resistance effect element according to a first embodiment of this invention.

FIGS. 4A to 4D are schematic sectional views following step sequence illustrating the method for manufacturing a magneto-resistance effect element according to a first embodiment of this invention.

That is, FIG. 4A represents the first step, and FIG. 4B represents the step following the step of FIG. 4A, and FIG. 4C represents the step following the step of FIG. 4B, and FIG. 4D represents the step following the step of FIG. 4C.

At first, a magneto-resistance effect element 101 to which the method for manufacturing a magneto-resistance effect element according to this embodiment is applied is described.

As shown in FIG. 2, a magneto-resistance effect element 101 to which the method for manufacturing a magneto-resistance effect element according to this embodiment is applied is a CCP-CPP element whose spacer layer 16 has an insulating layer 161 and conductive portion 162 forming current pathways in the thickness direction of the insulating layer 161.

The magneto-resistance effective element 101 has a bottom electrode 11, a top electrode 20, and a magneto-resistance effective film 10 provided between the bottom electrode 11 and the top electrode 20. The magneto-resistance effective element 101 is formed on a substrate which is not shown.

The magneto-resistance effective film 10 includes an underlayer 12, a pining layer (antiferromagnetic layer) 13, a pinned layer 14, a bottom metallic layer 15, a spacer layer (CCP-NOL) 16 (an insulating layer 161 and a conductive portion 162), a top metallic layer 17, a free layer 18, and a cap layer (protective layer) 19 which are sequentially stacked and formed. The magneto-resistance effective element 101 is an example of a bottom-type CCP-CPP element in which the pinned layer 14 is located below the free layer 18. The pinned layer 14 has a bottom pinned layer 141, an antiparallel magnetic coupling layer (magnetic coupling layer) 142 and a top pinned layer 143.

Among them, the pinned layer 14, the bottom metallic layer 15, the spacer layer 16, and the top metallic layer 17, and the free layer 18 correspond to a spin valve film sandwiching the non-magnetic spacer layer between the two ferromagnetic layers. The entirety of the bottom metallic layer 15, the spacer layer (CCP-NOL) 16 and the top metallic layer 17 is defined as an extended spacer layer 16s. For clarifying the structural feature of the magneto-resistance effect element, the spacer layer 16 is shown under the condition that the spacer layer 16 is separated from the top and bottom layers (the bottom metallic layer 15 and the top metallic layer 17).

The spacer layer (CCP-NOL) 16 has the insulating layer 161 and the conductive portion 162 (metallic film) penetrating through the insulating layer 161.

As described above, The magneto-resistance effective element 101 has the pinned layer 14 to be a first magnetic layer, the free layer 18 to be a second magnetic layer, and a spacer layer 16 provided between the first magnetic layer and the second magnetic layer and including the insulating layer 161 and the conductive portion 162 (metallic layer) penetrating through the insulating layer 161.

For the pinned layer 14 and the free layer 18, various magnetic materials can be used. The pinned layer 14 and the free layer 18 will be described later.

In the spacer layer 16, the insulating layer 161 is mainly composed of metal oxide and metal nitride. On the other hand, the conductive portion 162 is mainly composed of metallic film.

For example, for the insulating layer 161, for example, $Al_2O_3$ is used.

The conductive portion 162 is a pathway flowing current vertically to the film surface of the spacer layer 16 and is for confining the current. The conductive portion 162 functions as a conductor passing through current in the vertical direction to the film surface of the insulating layer 161. That is, the spacer layer 16 has a current-confined-path structure (CCP structure) of the insulating layer 161 and the conductive portion 162, and the MR variation ratio is increased by the current-confined-path effect. For the conductive portion 162, metal such as Cu and forth is used.

This invention is not limited thereto and for the insulating layer 161 and the conductive portion 162, various materials to be described later can be used. Hereinafter, as an example, the case that the insulating layer 161 is made of $Al_2O_3$ and the conductive portion 162 is made of Cu will be described.

The bottom metallic layer 15 and the top metallic layer 17 are, for example, layers for enhancing crystallinity or the like of the various layers included in the magneto-resistance effect element 101 and are provided as necessary. Hereinafter, for simplifying the explanation, a case when the bottom metallic layer 15 and the top metallic layer 17 are not used will be described.

The conductive portion 162 is a region having drastically less content of oxygen and nitrogen than that in the insulating layer 161. For example, the content of oxygen in the insulating layer 161 is at least twice or lager than that in the conductive portion 162. The content of oxygen or nitrogen in the conductive portion 162 is not 0%, and, for example, the conductive portion 162 includes larger amount of oxygen and nitrogen than that of the case in which the insulating layer does not exist circumferentially.

The conductive portion 162 has generally crystal phase but its orientation is worse than that of continuous film or metal of bulk. In the case of CCP-CPP element, as the amount of oxygen of the conductive portion 162 decreases, the specific resistance of the conductive portion 162 is decreased and higher MR variation ratio is obtained.

Meanwhile, is desired that the resistivity of the insulating layer 161 is high, because the current-confined-path effect becomes high as the difference between the electric resistivity of the insulating layer 161 and that of the conductive portion 162 becomes large.

Therefore, it is desired that the conductive portion 162 has smaller amount of the oxygen impurities and the insulating layer 161 has a state of metal oxide, a state of metal nitride and a state of metal oxynitride increasing insulating performance.

For example, as the insulating layer 161, $Al_2O_3$ generated by oxidization of Al for base material is used and if the oxidization is insufficient, the insulating performance is degraded, but, as described follows, in the method for manufacturing a magneto-resistance effect element according to this embodiment, amount of oxygen in the conductive portion 162 can be decreased recovering lack of oxidization of the insulating layer 161.

Thereby, the conductivity of the conductivity portion 162 keeping the insulating performance of the insulating layer 161 and high MR variation ratio is obtained. As described later, also by improving crystallinity of the conductive portion 162, higher MR variation ratio can be obtained. According to the method for manufacturing a magneto-resistance effect element according to this embodiment, crystallinity may be improved, and the high MR variation ratio is also realized from this aspect.

As shown in FIG. 1, in the method for manufacturing a magnetic-resistive effect element according to this embodiment, the following steps are performed between the step of forming the first magnetic layer including ferromagnetic material and the step of forming the second magnetic layer including the ferromagnetic material.

That is, first of all, a film to be a base material of the spacer layer 16 is formed (Step S110).

As shown in FIG. 4A, for example, on a layer 14a including the first magnetic layer, a first metallic film 16a to be the conductive portion 162 and a second metallic layer 16b to be the insulating layer 161 are film-formed and stacked. The first metallic film 16a is, for example, made of Cu. The second metallic film 16b is made of Al. The second metallic film 16b may be made of AlCu.

And, the films (the first metallic film 16a and the second metallic film 16b) are submitted to a first treatment using a gas including at least one of oxygen molecules, oxygen atoms, oxygen ions, oxygen plasma and oxygen radicals (Step 120).

Herein after, the above mentioned treatment is described with an abbreviated expression of "treatment using oxygen".

For example, as shown in FIG. 4B, first PIT (Pre Ion Treatment) by an Ar ion beam 91 is performed (Step 120a illustrated in FIG. 3). Then, as shown in FIG. 4C, IAO (Ion Assisted Oxidation) by an oxygen ion beam 92 is performed (Step S120b illustrated in FIG. 3). As described above, the second step (Step S120) performing the first treatment by using an oxygen gas may include the PIT step (Pretreatment step by using a rare gas: Step S120a) and the IAO step (Modification step by using a rare gas and an oxygen gas: Step S120b).

By PIT, portions of the first metallic film 16a in the lower side are sucked up to the side of second metallic film 16b. And, the portions of the first metallic film 16a penetrate through the second metallic film 16b to form the conductive portion 162. And, by the IAO by using the oxygen gas (oxygen ion beam 92 in this case), the first metallic film 16a and the second metallic film 16b are submitted to oxidizing treatment.

In this case, by selecting materials used in the first metallic film 16a and the second metallic film 16b, selective oxidation is performed. For the first metallic film 16a to be the conductive portion 162, a material having high oxidation generation energy is used, and for the second metallic film 16b to be the insulating layer 161, a material having low oxidation generation energy is used. That is, in the conductive portion 162, a material that is hard to be oxidized and easy to be reduced more than that of the insulating layer 161 is used.

In this specific example, the second metallic film 16b made of Al is oxidized to be $Al_2O_3$ and the insulating layer 161 is formed. And, the first metallic film 16a made of Cu is relatively hard to be oxidized, and a large amount thereof remains as the metal. However, a part thereof is oxidized and CuO is generated.

As a method for decreasing amount of CuO, a reduction of oxide is effective. In the reduction of CuO, CuO is reduced by nitrogen gas and CuO is converted into Cu metal by the following reaction formula.

$$2CuO + N_2 \rightarrow 2Cu + 2NO \quad (1)$$

In reduction by using nitrogen gas, is necessary to raise the temperature of the object in general, and there is no report that the reduction can be performed in room temperature. One reason thereof is that reactivity of $N_2$ molecules is low. In this embodiment, for solving this problem, it is effective that nitrogen molecule is dissociated and then reacted with CuO, and this effectiveness is utilized and applied.

$$N_2 \rightarrow 2N \quad (2)$$

$$2CuO + 2N \rightarrow 2Cu + 2NO \quad (3)$$

The reaction energy in the formula 3 is lower than the reaction energy in the formula 1 and CuO is more easily reduced. For realizing dissociation of hydrogen molecule $N_2$ shown in formula 2, it is effective to ionize, plasma-activate, and radical-activate the nitrogen molecules. Here, in this embodiment, a gas based on nitrogen has been used. Even in the cases of molecule and plasma, their forms are gases.

As shown in FIG. 4D, the above-described films are irradiated with a nitrogen ion beam 93, and thereby, CuO generated by oxidation of the first metallic film 16a is reduced and changed to Cu by the irradiation of nitrogen ion beam 93. The resistivity of the conductive portion 162 can be decreased.

At this time, also $Al_2O_3$ to be the insulating layer 161 is also submitted to the strong reducing treatment shown in the formula 4 and a portion where the oxidization is insufficient is generated.

$$2Al_2O_3 + 3N_2 \rightarrow 2Cu + 6NO \quad (4)$$

Although the amount of reduction of $Al_2O_3$ is smaller than that of CuO, it is preferable to decrease the portion where the oxidization is insufficient. In the portion where the oxidization is insufficient, the insulating performance is degraded and a leak current flows in this portion. In this case, the current-confined-path effect decreases and the MR variation ratio may become low.

With respect to these problems particularly concerning with the reduction treatment, the insulating performance can be improved by introducing nitrogen to the portion where the oxidization is insufficient and by nitriding Al which remains locally, for example. Thereby, the second metallic film 16b is converted into at least one of states of oxide, nitride and oxynitride and the insulating performance is ensured sufficiently. That is, for example, a reaction shown in the following formula.

$$2Al + 2N \rightarrow 2AlN \quad (5)$$

As shown in the formula 5, in this case, the nitride reaction can be more promoted by the reaction after dissociating nitrogen molecules.

On the bases on the above description, the films submitted to the first treatment (the first metallic film 16a, the second metallic film 16b and mixture of the insulating layer 161 and the conductive portion 162) are submitted to a first treatment using a gas including at least one of nitrogen ions, nitrogen atoms, nitrogen plasma, and nitrogen radicals (Step 120). Herein after, the above mentioned treatment is described with an abbreviated expression of "treatment using nitrogen".

As described above, according to the method for manufacturing a magneto-resistance effect element according to this embodiment, the oxide of the conductive portion 162 generated in forming the insulating layer 161 and conductive portion 162 is reduced, and the amount of oxygen impurities in the conductive portion is decreased while ensuring the insulating performance of the insulating layer 161 by nitriding the portion where the oxidization is insufficient. Thereby, the resistance of the conductive portion 162 is maintained to be high and at the same time, the resistance of the conductive portion 162 is decreased and the current-confined-path effect is effectively exerted. Thereby, the CCP-CPP type magneto-resistance effect element having higher MR variation ratio can be obtained.

By the way, in the above-described formula 3, some of the generated NO remain in Cu and come to oxidize, nitride or oxynitride the surrounding metal, and as a result, it may be occasionally difficult to decrease the amount of the oxygen impurities and nitrogen impurities of the conductive portion 162. NO easily disappears at a high temperature, but NO easily remains in room temperature. Accordingly, it has been found that in this embodiment, in performing the second treatment or after the second treatment, the substrate is heated or the same energy as heating is provided by irradiation with ion beam or plasma and these methods are effective for removing residual NO.

In the above description, as the method for converting the second metallic film 16b into the insulating layer 161, an example of performing IAO by the oxygen ion beam 92 has been described. However, this invention is not limited thereto, and method using at least one of oxygen molecules, oxygen atoms, oxygen ions, oxygen plasma and oxygen radicals can be used for the method for converting the second metallic film 16b into the insulating layer 161, and the method is discretional.

For example, a method of exposing the first metallic film 16a and the second metallic film 16b to an oxygen gas is also possible. In the case that the first metallic film 16a is Cu and the second metallic film 16b is Al, the oxygen exposure amount is appropriately, for example, from 10000 Langmuires to 50000 Langmuires. If smaller than 10000 Langmuires, oxidation of the second metallic film 16b is insufficient. If larger than 50000 Langmuires, oxidation of the first metallic film 16a begins.

In the first treatment, after IAO, treatment of irradiating rare gas ion or rare gas plasma or treatment of heating the substrate may be added. Thereby, separation between the insulating layer 161 and the conductive portion 162 can be more promoted. As the rare gas, at least any one of He, Ne, Ar, Xe, and Kr may be used, and in the case of irradiating the rare gas as ion beam, it is preferable that the beam voltage applied to the grid is 50 V or less and the irradiation time is 1 minute or less. In the case of irradiating the rare gas as RF plasma, it is preferable that the bias power is 10 W or less and the irradiation time is 1 minute or less. In the case of heating, the upper limit of the substrate temperature may be 80° C. The reason why such an upper limit is set is to prevent CCP-NOL from being broken.

COMPARATIVE EXAMPLE

In a method for manufacturing a magneto-resistance effect element of a comparative example, the third step (Step S130) illustrated in FIG. 1 is not performed. In the magneto-resistance effect element manufactured by the method of the first comparative example, the second metallic film 16b is oxidized by the first treatment of oxidizing in the second step (Step S120), and specifically, CuO is generated from Cu, and as a result, a large amount of oxygen impurities exists in the conductive portion 162. Moreover, there is a portion where the oxidization is insufficient in the insulating layer 161 and the insulating performance is poor.

Figure 5A:
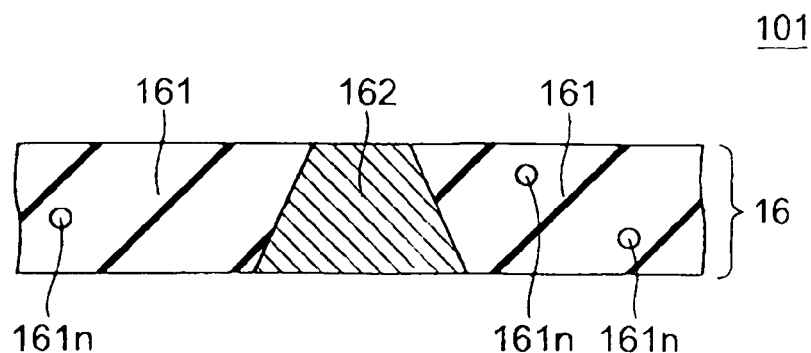
FIGS. 5A, 5B and 5C are schematic sectional views illustrating the states of the relevant parts of the magneto-resistance effect element according to the first embodiment and the first comparative example.
Figure 5B:
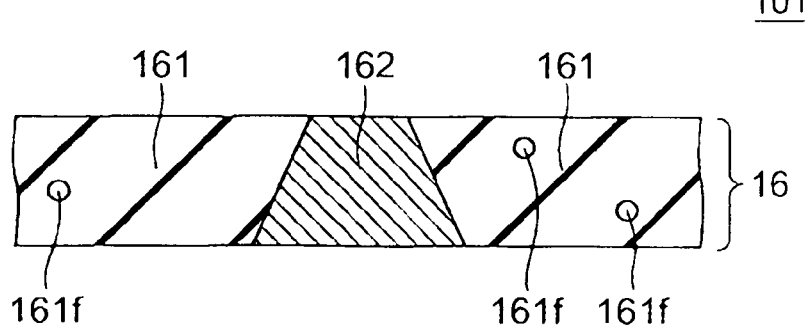

FIGS. 5A and 5B are schematic sectional views illustrating the states of the relevant parts of the magneto-resistance effect element according to the first embodiment of this invention and the magneto-resistance effect element according to the first comparative example.

Figure 5C:
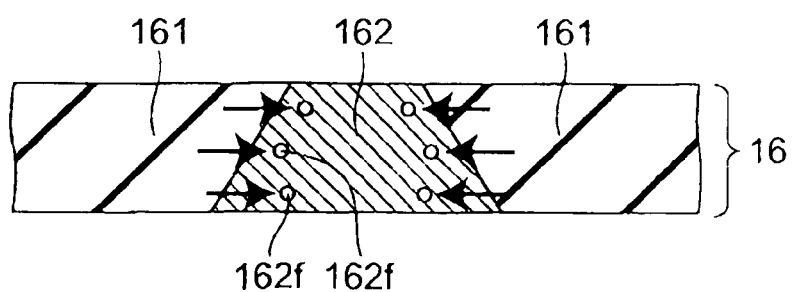

That is, FIG. 5A illustrates the state of the spacer layer 16 of the magneto-resistance effect element 101 according to this embodiment, and FIG. 5B illustrates the state of a midflow of in manufacturing the magneto-resistance effect element 101, that is the state of the spacer layer 16 in the midflow of the reduction treatment. FIG. 5C illustrates the state of the state of the spacer layer 16 of the magneto-resistance effect element 109 of the comparative example.

As shown in FIG. 5C, in the case of the magneto-resistance effect element 109 of the comparative example, Cu to be the conductive portion 162 is partially oxidized by the first treatment and CuO (162f) is generated even with small amount. By decreasing this CuO, the resistivity of the conductive portion 162 can be decreased and MR variation ratio can be improved. Therefore, the reduction treatment using nitrogen was performed.

As shown in FIG. 5B, in mid-flow in the reduction treatment, CuO (162f) is reduced to be Cu and the amount of CuO is greatly decreased. But, at the same time, $Al_2O_3$ is also reduced and the region 161f where the oxidization is insufficient in generated partially.

By contrast, as shown in FIG. 5A, in the magneto-resistance effect element 101 manufactured by the method for manufacturing a magneto-resistance effect element according to this embodiment, if the region 161f where the oxidization is insufficient is generated in the second treatment, it can be nitrided and converted into the nitrided region 161n, by the treatment using nitrogen. Thereby, the region 161f where the oxidization is insufficient disappears and the insulating performance of the insulating layer 161 is ensured.

For example, in the case that the second metallic layer 16b is Al, $Al_2O_3$ is generated in the first treatment using oxygen is generated and the region 161f where the oxidation is insufficient is generated in the reduction treatment. In this case, by the second treatment using nitrogen, the region 161 where the oxidation is insufficient is nitrided and converted into the nitrided region 161n. For example, AlN or AlNO is generated. Thereby, the insulating performance of the insulating layer 161 is ensured.

Furthermore, the crystallinity of the conductive portion 162 may be improved by these treatments, thereby the resistivity can be improved.

As described above, according to the method for manufacturing a magneto-resistance effect element according to this example, by reducing the conductive portion 162 and decreasing the resistivity while keeping the insulating performance of the insulating layer 161, the method for manufacturing the CCP-CPP type magneto-resistance effect element having high MR variation ratio can be provided.

By the way, in U.S. Pat. No. 6,033,584, a technique in which copper oxide is treated with hydrogen plasma and removed is disclosed, but in this technique, only the treatment with hydrogen plasma is performed, and this is not the combination of the first treatment (oxidation treatment) using an oxygen gas and the second treatment (reduction treatment) using a nitrogen gas like the method for manufacturing a magneto-resistance effect element according to this embodiment, and therefore, this technique is essentially different from this embodiment. That is, only by reduction treatment, from the first metallic film 16a and the second metallic film 16b, the insulating layer 161 and the conductive portion 162 cannot be formed, but only by the combination of the first treatment (oxidation treatment) using oxygen and the second treatment (reduction treatment) using nitrogen, the insulating layer 161 and the conductive portion 162 of high purity can be formed. Furthermore, by the technique disclosed in U.S. Pat. No. 6,033,584, the insulating performance cannot be improved by nitriding the region 161f where the oxidization is insufficient in the insulating layer 161.

An example of the configuration of a magneto-resistance effect element to which the method for manufacturing a magneto-resistance effect element according to the embodiment of this invention is applied will be described by referring FIG. 2.

The bottom electrode 11 functions as an electrode for flowing a current in the direction perpendicular to the spin valve film. The current can be flowed through the spin valve film in the direction perpendicular to the film surface thereof by applying a voltage between the bottom electrode 11 and the top electrode 20. The change in resistance of the spin valve film originated from the magneto-resistance effect can be detected by utilizing the current. In other words, the magnetization detection can be realized by the current flow. The bottom electrode 11 is made of a metallic layer with a relatively small electric resistance for flowing the current to the magneto-resistance effect element sufficiently. For example NiFe, Cu or the like are used for the bottom electrode.

The underlayer 12 may be composed of a buffer layer 12a (not shown) and a seed layer 12b (not shown). The buffer layer 12a can be employed for the compensation of the surface roughness of the bottom electrode 11. The seed layer 12b can be employed for controlling the crystalline orientation and the crystal grain size of the spin valve film to be formed on the underlayer 12.

The buffer layer 12a may be made of Ta, Ti, W, Zr, Hf, Cr or an alloy thereof. The thickness of the buffer layer 12a is preferably set within 2 to 10 nm, more preferably set within 3 to 5 nm. If the buffer layer 12a is formed too thin, the buffer layer 12a can exhibit the inherent buffering effect. If the buffer layer 12a is formed too thick, the DC resistance not contributing to the MR variation may be increased. If the seed layer 12b can exhibit the buffering effect, the buffer layer 12a may be omitted. In a preferable example, the buffer layer 12a is made of a Ta layer with a thickness of 3 nm.

The seed layer 12b may be made of any material controllable for the crystalline orientation of (a) layer(s) to be formed thereon. For example, the seed layer 12b may be made preferably of a metallic layer with an fcc-structure (face-centered cubic structure), an hcp-structure (hexagonal close-packed structure) or a bcc-structure (body-centered cubic structure). Concretely, the seed layer 12b may be made of Ru with hcp-structure or NiFe with fcc-structure so that the crystalline orientation of the spin valve film to be formed thereon can be rendered an fcc (111) faced orientation. In this case, the crystalline orientation of the pinning layer 13 (e.g., made of PtMn) can be rendered an fct-structure (face-centered tetragonal structure)-regulated orientation or a bcc (110) faced orientation. Moreover, Cr, Zr, Ti, Mo, Nb, W or an alloy layer thereof can be used.

In order to exhibit the inherent seeding function of the seed layer 12b of enhancing the crystalline orientation sufficiently, the thickness of the seed layer 12b is set preferably within 1 to 5 nm, more preferably within 1.5 to 3 nm. In a preferable example, the seed layer 12b may be made of a Ru layer with a thickness of 2 nm.

The crystalline orientation for the spin valve film and the pinning layer 13 can be measured by means of X-ray diffraction. For example, the FWHMs (full width at half maximum) in X-ray rocking curve of the fcc (111) peak of the spin valve film, the fct (111) peak or the bcc (110) peak of the pinning layer 13 (PtMn) can be set within a range of 3.5 to 6 degrees, respectively under good crystallinity. The dispersion of the orientation relating to the spin valve film and the pinning layer can be recognized by means of diffraction spot using cross section TEM.

The seed layer 12b may be made of a NiFe-based alloy (e.g., $Ni_XFe_{100-X}$: X=90 to 50%, preferably 75 to 85%) layer of a NiFe-based non-magnetic (($Ni_XFe_{100-X}$)$_{100-Y}X_Y$: X=Cr, V, Nb, Hf, Zr, Mo)) layer. In the latter case, the addition of the third element "X" renders the seed layer 12b non-magnetic. The crystalline orientation of the seed layer 12b of the NiFe-based alloy can be enhanced easily so that the FWHM in X-ray rocking curve can be rendered within a range of 3-5 degrees.

The seed layer 12b functions not only as the enhancement of the crystalline orientation, but also as the control of the crystal grain size of the spin valve film. Concretely, the crystal grain size of the spin valve film can be controlled within a range of 5 to 40 nm so that the fluctuation in performance of the magneto-resistance effect element can be prevented, and thus, the higher MR variation ratio can be realized even though the magneto-resistance effect element is downsized.

The crystal grain size of the spin valve film can be determined on the crystal grain size of the layer formed on the seed layer 12b by means of cross section TEM. In the case of a bottom type spin valve film where the pinning layer 14 is located below the spacer layer 16, the crystal grain size of the spin valve film can be determined on the crystal grain size of the pinning layer 13 (antiferromagnetic layer) or the pinned layer 14 (fixed magnetization layer) to be formed on the seed layer 12b.

With a reproducing head in view of high recording density, the element size is set to 100 nm or below, for example. Therefore, if the crystal grain size is set larger for the element size, the element characteristics may be fluctuated. In this point of view, it is not desired that the crystal grain size of the spin valve film is set larger than 40 nm. Concretely, the crystal grain size of the spin valve film is set preferably within 5 to 40 nm, more preferably within 5 to 20 nm.

Too large crystal grain size may cause the decrease of the number of crystal grain per element surface so as to cause fluctuation in characteristics of the reproducing head. With the CCP-CPP element forming a current confining path, it is not desired to increase the crystal grain size than a prescribed grain size. In contrast, too small crystal grain size may deteriorate the crystalline orientation. In this point of view, it is required that the crystal grain size is determined in view of the upper limited value and the lower limited value, e.g., within a range of 5 to 20 nm.

With the use of MRAM, however, the element size may be increased to 100 nm or over so that the crystal grain size can be increased to about 40 nm without the above-mentioned problem. Namely, if the seed layer 12b is employed, the crystal grain size may be increased than the prescribed grain size.

In order to set the crystal grain size within 5 to 20 nm, the seed layer 12b may be made of a Ru layer with a thickness of 2 nm or a NiFe-based non-magnetic (($Ni_XFe_{100-X}$)$_{100-Y}X_Y$: X=Cr, V, Nb, Hf, Zr, Mo, preferably y=0 to 30%)) layer.

In contrast, in the case that the crystal grain size is increased more than 40 nm and thus, is rendered coarse, the content of the third additive element is preferably increased more than the value described above. For example, with NiFeCr alloy, the content of Cr is preferably set within 35 to 45% so as to set the composition of the NiFeCr alloy to the composition exhibiting intermediate phase structure between the fcc-structure and the bcc-structure. In this case, the resultant NiFeCr layer can have the bcc-structure.

As described above, the thickness of the seed layer 12b is set preferably within 1 to 5 nm, more preferably within 1.5 to 3 nm. Too thin seed layer 12b may deteriorate the crystalline orientation controllability. In contrast, too thick seed layer 12b may increase the DC resistance of the element and rough the interface for the spin valve film.

The pinning layer 13 functions as applying the unidirectional anisotropy to the ferromagnetic layer to be the pinned layer 14 on the pinning layer 13 and fixing the magnetization of the pinned layer 14. The pinning layer 13 may be made of an antiferromagnetic material such as PtMn, PdPtMn, IrMn, RuRhMn, FeMn and NiMn. In view of the use of the element as a high density recording head, the pinning layer 13 is preferably made of IrMn because the IrMn layer can apply the unidirectional anisotropy to the pinned layer 14 in comparison with the PtMn layer even though the thickness of the IrMn layer is smaller than the thickness of the PtMn layer. In this point of view, the use of the IrMn layer can reduce the gap width of the intended element for high density recording.

In order to apply the unidirectional anisotropy with sufficient intensity, the thickness of the pining layer 13 is appropriately controlled. In the case that the pinning layer 13 is made of PtMn or PdPtMn, the thickness of the pinning layer 13 is set preferably within 8 to 20 nm, more preferably within 10 to 15 nm. In the case that the pinning layer 13 is made of IrMn, the unidirectional anisotropy can be applied even though the thickness of the pinning layer 13 of IrMn is set smaller than the thickness of the pinning layer 13 of PtMn. In this point of view, the thickness of the pinning layer 13 of IrMn is set preferably within 3 to 12 nm, more preferably within 4 to 10 nm. In a preferred embodiment, the thickness of the IrMn pinning layer 13 is set to 7 nm.

The pinning layer 13 may be made of a hard magnetic layer instead of the antiferromagnetic layer. For example, the pinning layer 13 may be made of CoPt (Co=50 to 85%), $(Co_XPt_{100-X})_{100-Y}Cr_Y$; X=50 to 85%, Y=0 to 40%) or FePt (Pt=40 to 60%). Since the hard magnetic layer has a smaller specific resistance, the DC resistance and the surface resistance RA of the element can be reduced.

In a preferred embodiment, the pinned layer 14 is formed as a synthetic pinned layer composed of the bottom pinned layer 141 (e.g., $Co_{90}Fe_{10}$ 3.5 nm), the magnetic coupling layer 142 (e.g., Ru) and the top pinned layer 143 (e.g., ($Fe_{50}Co_{50}$ 1 nm/Cu 0.25 nm)×2/$Fe_{50}Co_{50}$ 1 nm). The pinning layer 13 (e.g., IrMn layer) is coupled via magnetic exchange with the bottom pinned layer 141 formed on the pinning layer 13 so as to apply the unidirectional anisotropy to the bottom pinned layer 141. The bottom pinned layer 141 and the top pinned layer 143 which are located under and above the magnetic coupling layer 142, respectively, are strongly magnetically coupled with one another so that the direction of magnetization in the bottom pinned layer 141 becomes antiparalleled to the direction of magnetization in the top pinned layer 143.

The bottom pinned layer 141 may be made of $Co_XFe_{100-X}$ alloy (x=0 to 100), $Ni_XFe_{100-X}$ (X=0 to 100) or an alloy thereof containing a non magnetic element. The bottom pinned layer 141 may be also made of a single element such as Co, Fe, Ni or an alloy thereof.

It is desired that the magnetic thickness (saturated magnetization Bs×thickness t (Bs·t)) of the bottom pinned layer 141 is set almost equal to the one of the top pinned layer 143. Namely, it is desired that the magnetic thickness of the top pinned layer 143 corresponds to the magnetic thickness of the bottom pinned layer 141. For example, when the top pinned layer 143 of ($Fe_{50}Co_{50}$ 1 nm/Cu 0.25 nm)×2/$Fe_{50}Co_{50}$ 1 nm is employed, the magnetic thickness of the top pinned layer 143 is set to 2.2 T×3 nm=6.6 Tnm because the saturated magnetization of the top pinned layer 143 is about 2.2 T. When the bottom pinned layer 141 of $Co_{90}Fe_{10}$ is employed, the thickness of the bottom pinned layer 141 is set to 6.6 Tnm/1.8 T=3.66 nm for the magnetic thickness of 6.6 Tnm because the saturated magnetization of $Co_{90Fe10}$ is about 1.8 T. In this point of view, it is desired that the thickness of the bottom pinned layer 141 made of $Co_{90Fe10}$ is set to about 3.6 nm. When the pinned layer 13 IrMn, it is preferable to increase the Fe concentration in the bottom pinned layer 141 from $Co_{90}Fe_{10}$.

The thickness of the bottom pinned layer 141 is preferably set within 1.5 to 4 nm in view of the magnetic strength of the unidirectional anisotropy relating to the pinning layer 13 (e.g., IrMn layer) and the magnetic strength of the antiferromagnetic coupling between the bottom pinned layer 141 and the top pinned layer 143 via the magnetic coupling layer 142 (e.g., Ru layer). Too thin bottom pinned layer 141 causes the decrease of the MR variation ratio. In contrast, too thick bottom pinned layer 141 causes the difficulty of obtaining the unidirectional anisotropy magnetic field requiring for the operation of the element. In a preferred embodiment, the bottom pinned layer 141 may be made of a $Co_{75}Fe_{25}$ layer with a thickness of 3.6 nm.

The magnetic coupling layer 142 (e.g., Ru layer) causes the antiferromatic coupling between the bottom pinned layer 141 and the top pinned layer 143 which are located under and above the magnetic coupling layer 142. In the case that the magnetic coupling layer 142 is made of the Ru layer, the thickness of the Ru layer is preferably set within 0.8 to 1 nm. Only if the antiferromagnetic coupling between the pinned layers located under and above the magnetic coupling layer 142 can be generated, the magnetic coupling layer 142 may be made of another material except Ru or the thickness of the magnetic coupling layer 142 may be varied within 0.3 to 0.6 nm instead of the thickness range of 0.8 to 1 nm. The former thickness range of 0.3 to 0.6 nm corresponds to the first peak of RKKY (Runderman-Kittel-Kasuya-Yoshida), and the latter thickness range of 0.8 to 1 nm corresponds to the second peak of RKKY. In a preferred embodiment, the magnetic coupling layer 142 may be made of the Ru layer with a thickness of 0.9 nm so as to realize the antiferromagnetic coupling for the pinned layers stably.

The top pinned layer 143 may be made of ($Fe_{50}Co_{50}$ 1 nm/Cu 0.25 nm)×2/$Fe_{50}Co_{50}$ 1 nm. The top pinned layer 143 composes the spin dependent scattering unit. The top pinned layer 143 can contribute directly to the MR effect, and thus, the material and thickness of the top pinned layer 143 are important so as to realize a high MR variation ratio. The magnetic material of the top pinned layer 143 to be positioned at the interface for the CCP-NOL layer 16 is important in view of the contribution of the spin dependent interface scattering.

Then, the effect/function of the top pinned layer 143 of the $Fe_{50}Co_{50}$ layer with bcc-structure will be described. In this case, since the spin dependent interface scattering is enhanced, the MR variation ratio can be enhanced. As the FeCo-based alloy with bcc-structure, a $Co_XFe_{100-X}$ alloy (X=30 to 100) or a similar CoFe-based alloy containing an additive element can be exemplified. Among them, a $Fe_{40}Co_{60}$ alloy through a $Fe_{60}Co_{40}$ alloy may be employed in view of the above-described requirements.

In the case that the top pinned layer 143 is made of the magnetic layer with bcc-structure easily exhibiting the high MR variation ratio, the thickness of the top pinned layer 143 is preferably set to 1.5 nm or over so as to maintain the bcc-structure thereof stably. Since the spin valve film is made mainly of a metallic material with fcc-structure or fct-structure, only the top pinned layer 143 may have the bcc-structure. In this point of view, too thin top pinned layer 143 cannot maintain the bcc-structure thereof stably so as not to obtain the high MR variation ratio.

Herein, the top pinned layer 143 is made of the $Fe_{50}Co_{50}$ layers and the extremely thin Cu layers. The total thickness of the $Fe_{50Co50}$ layers is 3 nm and each Cu layer is formed on the corresponding $Fe_{50Co50}$ layer with a thickness of 1 nm. The thickness of the Cu layer is 0.25 nm and the total thickness of the top pinned layer 143 is 3.5 nm.

It is desired that the thickness of the top pinned layer 143 is set to 5 nm or below so as to generate a large pinning (fixing) magnetic field. In view of the large pinning (fixing) magnetic field and the stability of the bcc-structure in the top pinned layer 143, the thickness of the top pinned layer 143 is preferably set within 2 to 4 nm.

The top pinned layer 143 may be made of a $Co_{90}Fe_{10}$ alloy with fcc-structure or a Co alloy with hcp-structure which used to be widely employed for a conventional magneto-resistance effect element, instead of the magnetic material with the bcc-structure. The top pinned layer 143 can be made of a single element such as Co, Fe, Ni or an alloy containing at least one of Co, Fe, Ni. In view of the high MR variation ratio of the top pinned layer 143, the FeCo alloy with the bcc-structure, the Co alloy containing Co element of 50% or over and the Ni alloy containing Ni element of 50% or over are in turn preferable.

In this embodiment, the top pinned layer 143 is made of the magnetic layers (FeCo layers) and the non magnetic layers (extremely thin Cu layers). In this case, the top pinned layer 143 can enhance the spin dependent scattering effect which is also called as a "spin dependent bulk scattering effect", originated from the extremely thin Cu layers.

The spin dependent bulk scattering effect is utilized in pairs for the spin dependent interface scattering effect. The spin dependent bulk scattering effect means the occurrence of an MR effect in a magnetic layer and the spin dependent interface scattering effect means the occurrence of an MR effect at an interface between a spacer layer and a magnetic layer.

Hereinafter, the enhancement of the bulk scattering effect of the stacking structure of the magnetic layer and the non magnetic layer will be described. With the CCP-CPP element, since a current is confined in the vicinity of the spacer layer 16, the resistance in the vicinity of the spacer layer 16 contributes the total resistance of the magneto-resistance effect element. Namely, the resistance at the interface between the spacer layer 16 and the magnetic layers (pinned layer 14 and the free layer 18) contributes largely to the magneto-resistance effect element. That means the contribution of the spin dependent interface scattering effect becomes large and important in the CCP-CPP element. The selection of magnetic material located at the interface for the CCP-NOL layer 16 is important in comparison with a conventional CPP element. In this point of view, the pinned layer 143 is made of the FeCo alloy with the bcc-structure exhibiting the large spin dependent interface scattering effect as described above.

However, it may be that the spin dependent bulk scattering effect should be considered so as to develop the MR variation ratio. In view of the development of the spin dependent bulk scattering effect, the thickness of the thin Cu layer is set preferably within 0.1 to 1 nm, more preferably within 0.2 to 0.5 nm. Too thin Cu layer cannot develop the spin dependent bulk scattering effect sufficiently. Too thick Cu layer may reduce the spin dependent bulk scattering effect and weaken the magnetic coupling between the magnetic layers via the non magnetic Cu layer, which the magnetic layers sandwiches the non magnetic Cu layer, thereby deteriorating the property of the pinned layer 14. In a preferred embodiment, in this point of view, the thickness of the non-magnetic Cu layer is set to 0.25 nm.

The non-magnetic layer sandwiched by the magnetic layers may be made of Hf, Zr, Ti instead of Cu. In the case that the pinned layer 14 contains the non-magnetic layer(s), the thickness of the one magnetic layer such as a FeCo layer which is separated by the non-magnetic layer is set preferably within 0.5 to 2 nm, more preferably within 1 to 1.5 nm.

In the above embodiment, the top pinned layer 143 is constituted of the alternately stacking structure of FeCo layer and Cu layer, but may be made of an alloyed layer of FeCo and Cu. The composition of the resultant FeCoCu alloy may be set to $((Fe_XCo_{100-X})_{100-Y}Cu_Y$, X=30 to 100%, Y=3 to 15%), but set to another composition range. The third element to be added to the main composition of FeCo may be selected from Hf, Zr, Ti, Al instead of Cu.

The top pinned layer 143 may be also made of a single element such as Co, Fe, Ni or an alloy thereof. In a simplified embodiment, the top pinned layer 143 may be made of an $Fe_{90}Co_{10}$ layer with a thickness of 2 to 4 nm, as occasion demands, containing a third additive element.

Then, the film structure in the extended spacer layer will be described. The bottom metallic layer 15 is a remained layer used as supplier for the formation of the conductive portion 162 in the process described later. It is not required that the bottom metallic layer 15 remains after the process.

The spacer layer (CCP-NOL) 16 includes the insulating layer 161 and the conductive portion 162. As already mentioned, the spacer layer 16, the bottom metallic layer 15 and the top metallic layer 17 are treated as the extended spacer layer 16s.

The insulating layer 161 is made of oxide, nitride, oxynitride or the like. For example, the insulating layer 161 may be made of an $Al_2O_3$ amorphous structure or an MgO crystalline structure. In order to exhibit the inherent function of the spacer layer, the thickness of the insulating layer 161 is set preferably within 1 to 5 nm, more preferably within 1.5 to 4.5 nm.

The insulating layer 161 may be made of a typical insulating material such as $Al_2O_3$-based material, as occasion demands, containing a third additive element such as Ti, Hf, Mg, Zr, V, Mo, Si, Cr, Nb, Ta, W, B, C, V. The content of the additive element may be appropriately controlled within 0 to 50%. In a preferred embodiment, the insulating layer 161 is made of an $Al_2O_3$ layer with a thickness of about 2 nm.

The insulating layer 161 may be made of Ti oxide, Hf oxide, Mg oxide, Zr oxide, Cr oxide, Ta oxide, Nb oxide, Mo oxide, Si oxide or V oxide instead of the Al oxide such as the $Al_2O_3$. In the use of another oxide except the Al oxide, a third additive element such as Ti, Hf, Mg, Zr, V, Mo, Si, Cr, Nb, Ta, W, B, C, V may be added to the oxide as occasion demands. The content of the additive element may be appropriately controlled within 0 to 50%.

The insulating layer 161 may be also made of a nitride or an oxynitride containing, as a base material, Al, Si, Hf, Ti, Mg, Zr, V, Mo, Nb, Ta, W, B, C only if the insulating layer 161 can exhibit the inherent insulating function.

The conductive portion 162 functions as a path to flow a current in the direction perpendicular to the film surface of the spacer layer 16 and then, confining the current. The conductive portion 162 (CCP) may be made of Au, Ag, Ni, Co, Fe or an alloy containing at least one from the listed elements instead of Cu. In a preferred embodiment, the conductive portion 162 is made of a Cu alloy. The conductive portion 162 may be made of an alloy layer of CuNi, CuCo or CuFe. Herein, the content of Cu in the alloy is set preferably to 50% or over in view of the enhancement of the MR variation ratio and the reduction of the interlayer coupling field, Hin between the pinned layer 14 and the free layer 18.

The top metallic layer 17 is a portion of the extended spacer layer 16s. It functions as a barrier layer protecting the oxidization of the free layer 18 to be formed thereon through the contact with the oxide of the CCP-NOL layer 16 so that the crystal quality of the free layer 18 cannot be deteriorated. For example, when the insulating layer 161 is made of an amorphous material (e.g., $Al_2O_3$), the crystal quality of a metallic layer to be formed on the layer 161 may be deteriorated, but when a layer (e.g., Cu layer) to develop the crystal quality of fcc-structure is provided (under the condition that the thickness of the metallic layer is set to 1 nm or below), the crystal quality of the free layer 18 can be remarkably improved.

It is not always required to provide the top metallic layer 17 dependent on the kind of material in the extreme thin oxide layer 16 and/or the free layer 18. Moreover, if the annealing condition is optimized and the appropriate selection of the materials of the insulating layer 161 of the thin oxide layer 16 and the free layer 18 is performed, the deterioration of the crystal quality of the free layer 18 can be prevented, thereby omitting the metallic layer 17 of the spacer layer 16.

In view of the manufacturing yield of the magneto-resistance effect element, it is desired to form the top metallic layer 17 on the spacer layer 16. In a preferred embodiment, the top metallic layer 17 can be made of a Cu layer with a thickness of 0.5 nm.

The top metallic layer 17 may be made of Au, Ag, Ru or the like instead of Cu. Moreover, it is desired that the top metallic layer 17 is made of the same material as the material of the conductive portion 162 of the spacer layer 16. If the top metallic layer 17 is made of a material different from the material of the conductive portion 162, the interface resistance between the layer 17 and the path 162 is increased, but if the top metallic layer 17 is made of the same material as the material of the conductive portion 162, the interface resistance between the layer 17 and the path 162 is not increased.

The thickness of the top metallic layer 17 is set preferably within 0 to 1 nm, more preferably within 0.1 to 0.5 nm. Too thick top metallic layer 17 may extend the current confined through the spacer layer 16 thereat, resulting in the decrease of the MR variation ratio due to the insufficient current confinement.

The free layer 18 is a ferromagnetic layer of which the direction of magnetization is varied commensurate with the external magnetic field. For example, the free layer 18 is made of a double-layered structure of $Co_{90}Fe_{10}$ 1 nm/$Ni_{83}Fe_{17}$, 3.5 nm. In this case, in order to realize the high MR variation ratio, the selection of magnetic material of the free layer 18 in the vicinity of the spacer 16, that is, at the interface therebetween is important. In this case, it is desired that the $Co_{90}Fe_{10}$ layer is formed at the interface between the free layer 18 and the spacer layer 16. The free layer 18 may be made of a single $Co_{90}Fe_{10}$ layer with a thickness of 4 nm without a NiFe layer or a triple-layered structure of CoFe/NiFe/CoFe.

Then, the free layer 18 is made of an alternately stacking structure of CoFe layers or Fe layers with a thickness of 1 to 2 nm and extremely thin Cu layers with a thickness of 0.1 to 0.8 nm.

In the case that the spacer layer 16 is made of the Cu layer, it is desired that the FeCo layer with bcc-structure is employed as the interface material thereof for the spacer layer 16 so as to enhance the MR variation ratio in the same manner as the pinned layer 14. Moreover, in order to improve the stability in the bcc structure, a thickness not smaller than 1 nm is preferable and a thickness not smaller than 1.5 nm is more preferable. The increase of the thickness in bcc structure brings about an increase of coercivity and magnetostriction. Therefore, the thick bcc structure is difficult to be used for the free layer. To solve this problem, it is available to adjust the composition and film thickness of laminating NiFe alloy. In a preferred embodiment, a $Co_{60}Fe_{40}$ 2 nm/$Ni_{95}Fe_5$ 3.5 nm may be employed.

The cap layer 19 functions as protecting the spin valve film. The cap layer 19 may be made of a plurality of metallic layers, e.g., a double-layered structure of Cu 1 nm/Ru 10 nm. The layered turn of the Cu layer and the Ru layer may be switched so that the Ru layer is located in the side of the free layer 18. In this case, the thickness of the Ru layer is set within 0.5 to 2 nm. The exemplified structure is particularly desired for the free layer 19 of NiFe because the magnetostriction of the interface mixing layer formed between the free layer 18 and the cap layer 19 can be lowered due to the non-solution between Ru and Ni.

When the cap layer 19 is made of the Cu/Ru structure or the Ru/Cu structure, the thickness of the Cu layer is set within 0.5 to 10 nm and the thickness of the Ru layer is set smaller, e.g., within 0.5 to 5 nm due to the large specific resistance.

The cap layer 19 may be made of another metallic layer instead of the Cu layer and/or the Ru layer. The structure of the cap layer 19 is not limited only if the cap layer 19 can protect the spin valve film. If the protective function of the cap layer 19 can be exhibited, the cap layer 19 may be made of still another metal. Attention should be paid to the cap layer because the kind of material of the cap layer may change the MR variation ratio and the long reliability. In view of the stable MR variation ratio and long reliability, the Cu layer and/or the Ru layer is preferable for the cap layer.

The top electrode 20 functions as flowing a current through the spin valve film in the direction perpendicular to the film surface of the spin valve film. The intended current can be flowed through the spin valve film in the direction perpendicular to the film surface by applying a voltage between the top electrode 20 and the bottom electrode 11. The top electrode 20 may be made of a material with smaller resistance (e.g., Cu, Au, NiFe or the like).

The method for manufacturing a magneto-resistance effect element according to this embodiment can be applied to any one of the magneto-resistance effect elements having such a configuration.

Next, the third step (Step S130) in the method for manufacturing a magneto-resistance effect element according to this embodiment, namely, the specific example of the second treatment using nitrogen will be described.

Figure 6A:
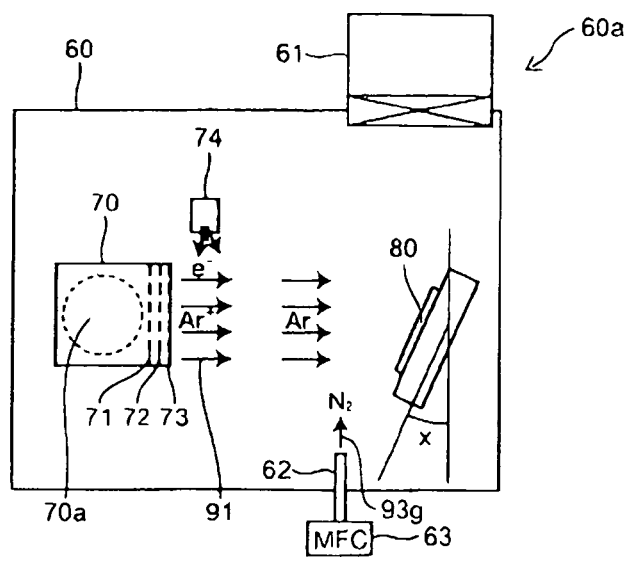
FIGS. 6A, 6B and 6C are schematic views illustrating configurations of parts in the method for manufacturing according to the first embodiment of this invention.
Figure 6B:
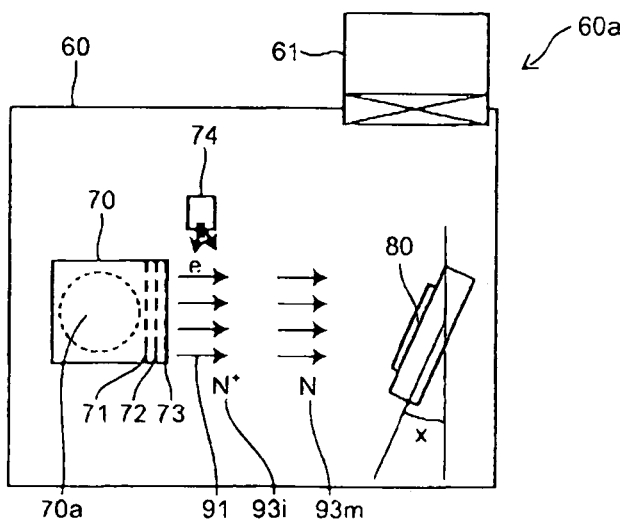
Figure 6C:
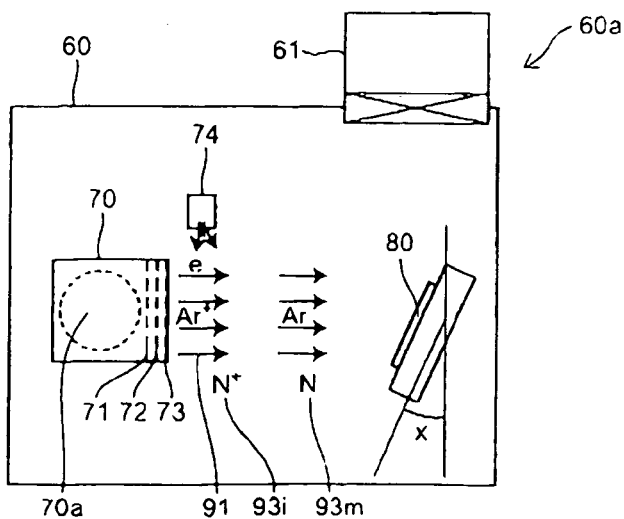

FIGS. 6A to 6C are schematic views illustrating configurations of parts in the method for manufacturing the magneto-resistance effect element according to the first embodiment of this invention.

That is, these figures illustrate three configurations of treatment apparatuses that can be used for the second treatment in the method for manufacturing a magneto-resistance effect element according to this embodiment.

FIG. 6A is a configuration in which exposure to nitrogen gas while irradiating ion beam or plasma of rare gas.

As shown in FIG. 6A, the treatment apparatus 60a has a vacuum chamber 60 connected to a vacuum pump 61, and inside of the vacuum chamber 60 is made to be high vacuum. In the vacuum chamber 60, the object to be treated 80p (in this case, the laminated structure of the layer 14a including the film to be pinned layer 14 and the first metallic film 16a and the second metallic film 16b that are submitted to the first treatment) is placed. And, in the vacuum chamber 60, a plasma 70a generated from an ion source 70 is accelerated by grids 71, 72 and 73. In this example, Ar ion is used, and thereby Ar ion beam 91 is generated. In this case, neutralization is performed by a neutralizer 74. On the other hand, a nitrogen gas 93g controlled by mass flow controller (MFC) 63 is introduced through a supply pipe 62 into the vacuum chamber 60. And, in an atmosphere of the nitrogen gas 93g, the Ar ion beam 91 is irradiated to the object to be treated 80. In the above case, Ar plasma may be irradiated to the object to be treated 80 instead of the Ar ion beam 91.

As described above, in the exposure to nitrogen gas 93g, by irradiating ion beams or plasma of rare gas, nitrogen radicals are generated in the nitrogen gas 93g. Then, the object to be treated 80 is treated by using the nitrogen radicals. Thereby, the region 161f where the oxidation is insufficient in the insulating layer 161 is nitrided. In addition, the reduction can be promoted by cutting oxygen bonds of the oxide in the conductive portion 162.

Moreover, nitrogen gas is ionized and nitrogen ions are generated, and the nitrogen ions can be irradiated to the object to be treated 80.

As shown in FIG. 6B, for example, the nitrogen gas 93g is introduced into the ion source 70 and plasma-activated, and thereby, monomer nitrogen 93m is obtained. Monomer nitrogen 93m represents a form of nitrogen existing as a free atom not but the molecule form in gas. The monomer nitrogen 93m may be ion having charge or electrically neutral atom. To this nitrogen plasma, voltage is applied and accelerated by the grids 71, 72, 73, and thereby, beam of nitrogen ion 93i is taken out. The nitrogen ion beam having charge is electrically neutralized by the neutralizer 74 and reaches the object to be treated 80. Thereby, the efficiency of the reduction in the conductive portion 162 is improved while the efficiency of the nitride in the insulating layer 161 is improved. This is because the reduction of the oxide is not promoted substantially by nitrogen molecules ($N_2$) but the reduction comes to be easily promoted by using monomer nitrogen 93m.

In this case, it is preferable that the flow rate of the nitrogen gas 93g introduced into the ion source is from 1 sccm to 100 sccm inclusive. If lower than 1 sccm, the reduction of the oxide in the conductive portion 162 is insufficient, and if higher than 100 sccm, the reduction of the oxide of the second metallic film 16b to be the insulating layer 161 begins.

In this method, because the reduction efficiency is high, the appropriate flow rate is lower than that of the case of the exposure to the helium gas 93g described with respect to FIG. 6A. It is desirable that the voltage applied to the grids 71, 72 and 73 is from 0 V to 50 V inclusive. The case of 0 V is the state in which nitrogen ion 93i getting out from the grids is utilized. In the case of RF plasma, the power is from 10 W to 1000 W inclusive. The reason why weak voltage or RF power is used as described above is to prevent CCP-NOL from being broken by reducing $Al_2O_3$ to be the insulating layer 161.

Furthermore, the nitrogen ion 93i and rare gas ion can be irradiated to the object to be treated 80 at the same time.

As shown in FIG. 6C, the nitrogen ion 93i (monomer nitrogen 93m) and rare gas ion (Ar ion beam 91) are irradiated to the object to be treated 80 at the same time, and thereby, the efficiency of reduction can be further improved.

In this case, it is preferable that the flow rate of the nitrogen gas 93g introduced into the ion source is from 1 sccm to 100 sccm inclusive. If lower than 1 sccm, the reduction of the oxide in the conductive portion 162 is insufficient, and if higher than 100 sccm, the reduction of the oxide of the second metallic film 16b to be the insulating layer 161 begins.

Also, in this method, because the reduction efficiency is high, the appropriate flow amount is smaller than that of the case of the exposure to the nitrogen gas 93g described with respect to FIG. 6A. It is desirable that the voltage applied to the grids 71, 72 and 73 is from 0 V to 50 V inclusive. The case of 0 V is the state in which nitrogen ion 93i getting out from the grids is utilized. In the case of RF plasma, the power is from 10 W to 1000 W inclusive. The reason why weak voltage or RF power as described above is used is to prevent CCP-NOL from being broken by reducing $Al_2O_3$.

In the above-described second treatment using nitrogen, the treatment may be performed with heating the insulating layer 161 and the conductive portion 162. During heating the insulating layer 161 and the conductive portion 162, the exposure to the nitrogen gas 93g or treatment of irradiation of various types of nitrogen ion 93i and or nitrogen plasma, which has been explained with respect to the FIGS. 6A to 6C. Thereby, the reduction efficiency is enhanced and the treatment can be more efficiently performed.

By the second treatment is performed with heating the first metallic film 16a and the second metallic film 16b, NO generated in the second treatment can also be removed. Furthermore, the crystallinity may be improved.

The same effect as heating can also be obtained by irradiating the ion beam or the plasma of rare gas. In this case, the configuration is similar to the configuration shown in the FIG. 6C, but because the purposes are different, the flow rates of Ar gas are different. In the case of FIG. 6C performing only reduction, it is desirable that the Ar amount is 10 sccm or less. This is because the ratio of the nitrogen gas 93 is maintained to be higher with respect to Ar so that the effect of nitrogen gas 93m is not eliminated by Ar. By contrast, in the case of obtaining removal of NO and the improvement of crystallinity with the reduction, the Ar amount is positively increased to be 10 sccm or more. In this case, nitrogen becomes diluted, and therefore, the adjustment is performed by changing the condition of the beam to be stronger or prolonging the time of irradiation.

After performing Step S110 to Step S130, further the Step S120 (the first treatment of the second time) may be performed. Thereby, oxidation by the first treatment and reduction by the second treatment can be adjusted. Furthermore, after the first treatment of the second time, the second treatment of the second time may be performed. As described above, after the step S110 of film formation, the combination of Step S120 and Step S130 can be repeatedly performed. Thereby, the structure of the insulating layer 161 and the conductive portion 162 can be precisely controlled.

Figure 7:
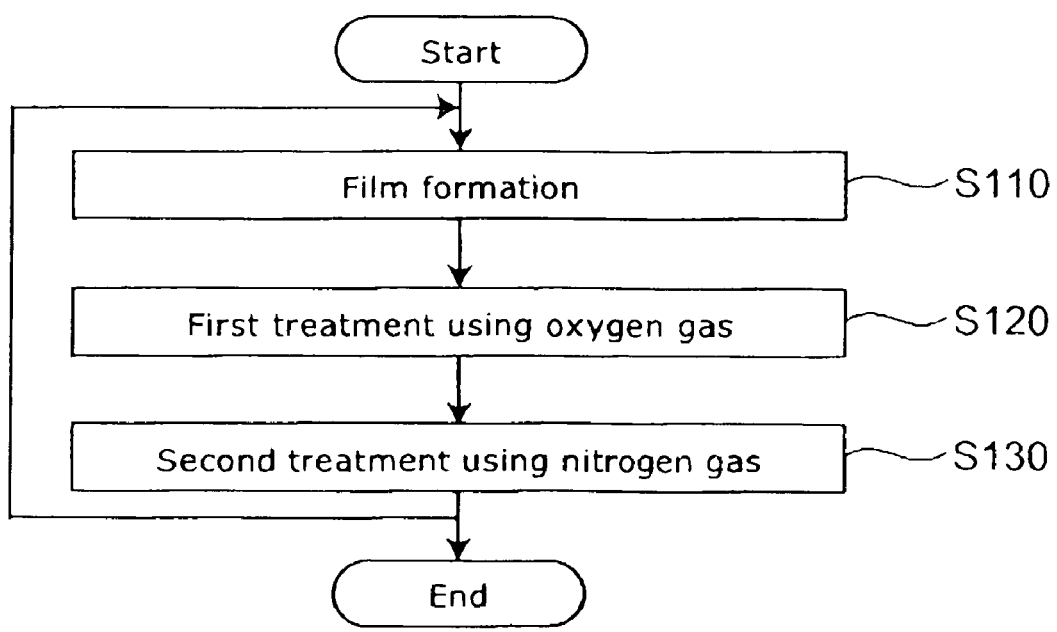
FIG. 7 is a flow chart illustrating another method for manufacturing according to the first embodiment of this invention.

FIG. 7 is a flow chart illustrating another method for manufacturing a magneto-resistance effect element according to the first embodiment of this invention.

As shown in FIG. 7, in another method for manufacturing a magneto-resistance effect element according to the first embodiment of this invention, the first step (Step S110), the second step (Step S120), and the third step (Step S130), which have been explained with respect to FIG. 1, are repeated plural times and performed.

Hereinafter, the example of the case of two repeating times will be described.

Also in this case, the second step (Step S120) may include the PIT step (Step S120a illustrated in FIG. 3) and the IAO step (Step S120b illustrated in FIG. 3).

FIGS. 8A to 8H are schematic sectional views following step sequence illustrating another method for manufacturing a magneto-resistance effect element according to a first embodiment of this invention.

Figure 8A:
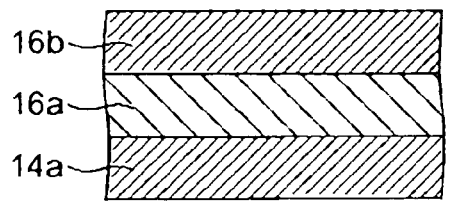
FIGS. 8A to 8H are schematic sectional views following step sequence illustrating another method for manufacturing according to a first embodiment of this invention.
Figure 8B:
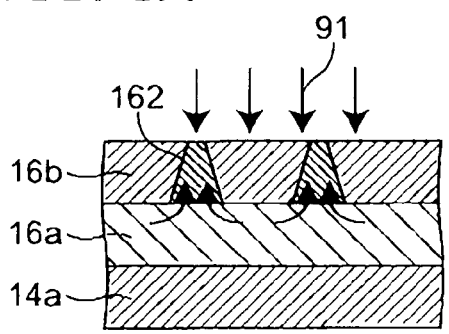
Figure 8C:
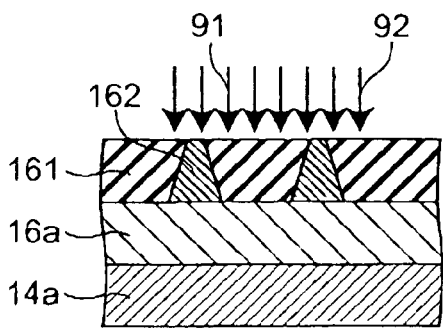
Figure 8D:
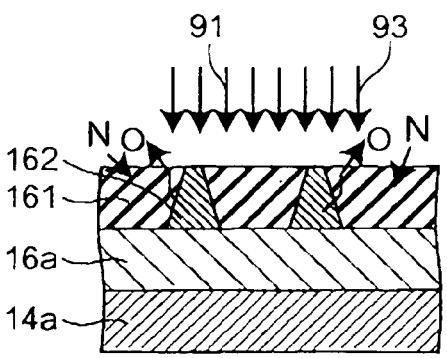

That is, FIG. 8A is a figure showing the first step, and Each of FIGS. 8B to 8H is a view showing the step following its previous step.

FIGS. 8A to 8D are the same as FIGS. 4A to 4D, and therefore, the explanation thereof will be omitted.

Figure 8E:
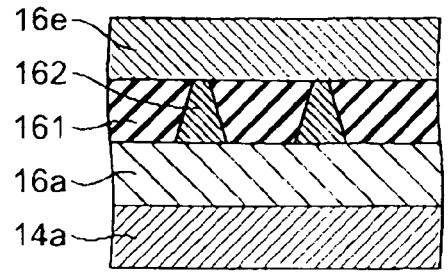

As shown in FIG. 8E, Step S110 of the second time is performed. That is, after Step S110 to Step S130 of the first time (formation of the film to be base material of the spacer layer 16, the first treatment using oxygen, the second treatment using nitrogen), the second metallic film 16e of the second layer is formed. The second metallic film 16e of the second layer is also, for example, Al. The second metallic film 16e of the second layer may be AlCu.

Then, Step S120 of the second time is performed.

Figure 8F:
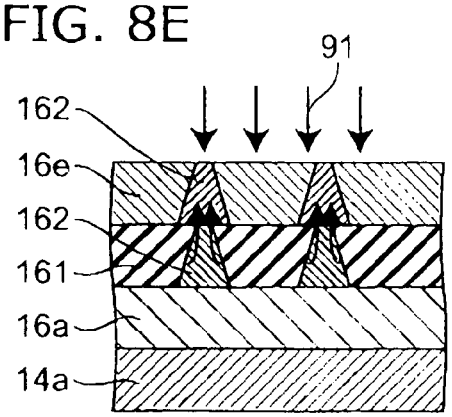

That is, as shown in FIG. 8F, PIT by the Ar ion beam 91 is performed. Thereby, the conductive portion 162 formed by the Step S110 to Step S130 of the first time are further sucked up into the second metallic film 16e of the second layer and penetrates through the second metallic film 16e of the second layer.

Figure 8G:
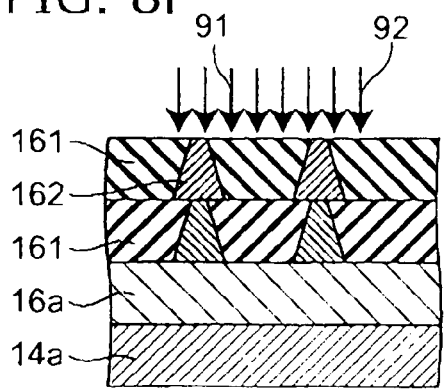

And, as shown in FIG. 8G, the second metallic film 16e of the second layer is submitted to the oxidizing treatment by IAO that is the first treatment using oxygen (in this case, oxygen ion beam 92). Thereby, the second metallic film 16e of the second layer that is Al is oxidized to be $Al_2O_3$ to form the insulating layer 161.

Subsequently, Step S130 of the second time is performed.

Figure 8H:
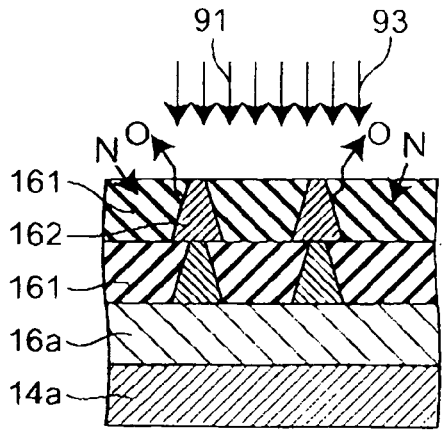

That is, as shown in FIG. 8H, the above-described film is irradiated with the nitrogen ion beam 93 for example, and CuO generated by oxidation of the first metallic film 16a is reduced to be Cu while introducing nitrogen into the insulating layer 161 to nitride the region 161f where the oxidization is insufficient. Also in this case, a condition in which $Al_2O_3$ to be the insulating layer 161 is not substantially reduced and CuO is reduced is appropriately selected, and thereby, the resistance of the conductive portion 162 can be decreased with substantially no adverse effect to the insulating characteristics of the insulating layer 161.

As described above, according to the method for manufacturing a magneto-resistance effect element according to this embodiment, the oxide in the conductive portion 162 generated during forming the insulating layer 161 and the conductive portion 162 is reduced, and the amount of oxygen impurities in the conductive portion 162 is decreased. And, by performing plural times of formation of the film to be the spacer layer 16, the film thickness of each of the formed films becomes thin, and thereby, the stress in the film can be relaxed. Moreover, for each of the thin films, for example, PIT and IAO (the first treatment), and the second treatment are performed, and therefore, because each of the thin films is submitted to these treatments, the structure of the film is stabilized and the film becomes dense. Furthermore, these treatments are for activating the surface and the adhesive force of the film is improved and the reliability of the magneto-resistance effect element is improved.

Also, when a thick film as the spacer layer 16 is required, the formation of the film is performed plural times, and each of the films is submitted to the above-described treatment, and thereby, with maintaining the performance, the film thickness of the spacer layer 16 can be increased.

Thereby, the CCP-CPP type magneto-resistance effect element with high reliability having high MR variation ratio can be obtained.

Second Embodiment

Figure 9:
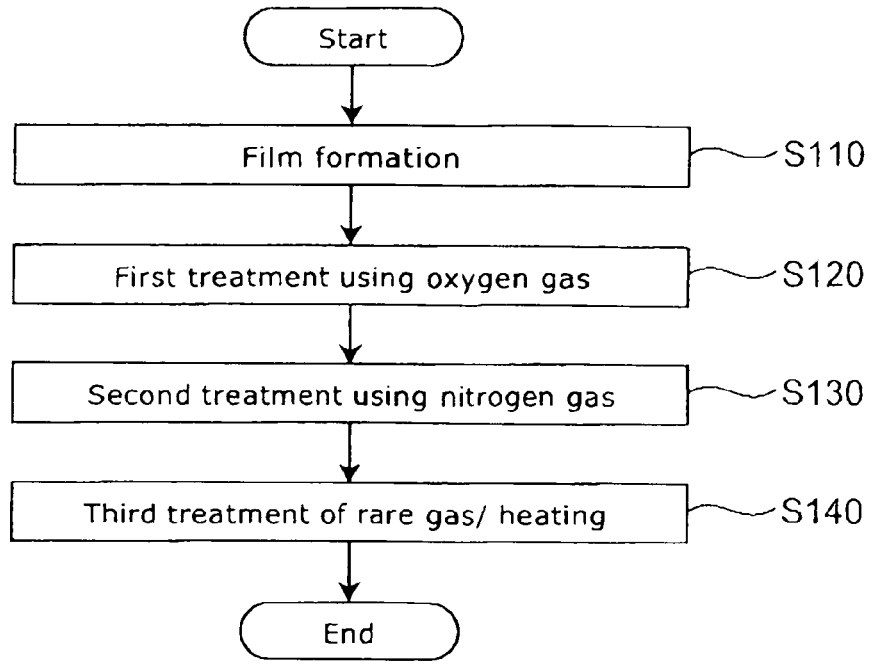
FIG. 9 is a flow chart illustrating a method for manufacturing according to a second embodiment of this invention.

FIG. 9 is a flow chart illustrating a method for manufacturing a magneto-resistance effect element according to a second embodiment of this invention.

As shown in FIG. 9, in the method for manufacturing a magneto-resistance effect element according to a second embodiment of this invention, after the first step (Step S110), the second step (Step S120) and the third step (Step S130), which are explained with respect to FIG. 1, further a fourth step (Step S140) is carried out.

Also in this step, the second step (Step S120) may include the PIT step (Step S120a illustrated in FIG. 3) and the IAO step (Step S120b illustrated in FIG. 3).

In the fourth step, the film submitted to the second treatment is submitted to the third treatment of at least any one of irradiation of argon ions, irradiation of argon plasma, and heating.

As the third treatment, the insulating layer 161 and the conductive portion 162 are submitted to, for example, irradiation of Ar ion beam or irradiation of Ar plasma. Or, as the third treatment, the insulating layer 161 and the conductive portion 162 are heated. Or, as the third treatment, during heating the insulating layer 161 and the conductive portion 162, for example, irradiation of Ar ion beam or irradiation of Ar plasma is performed.

Thereby, NO generated by the second treatment can be removed.

Figure 10A:
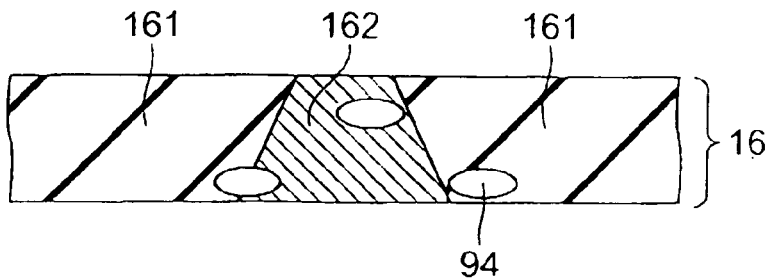
FIGS. 10A and 10B are schematic sectional views illustrating the effect of the method for manufacturing according to the second embodiment of this invention.
Figure 10B:
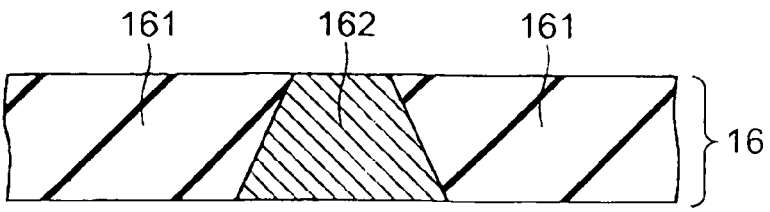

FIGS. 10A and 10B are schematic sectional views illustrating the effect of the method for manufacturing a magneto-resistance effect element according to the second embodiment of this invention.

That is, FIG. 10A illustrates the state after the second treatment, and FIG. 10B illustrates the state after the third treatment.

As shown in FIG. 10A, after the second treatment, in the insulating layer 161 and the conductive portion 162, NO 94 generated by the second treatment occasionally remains. In this case, the residual NO 94 diffuses in the anneal step after finishing stacking all of the films and can oxidize the surrounding metallic films. The conductive portion 162 reduced in the second treatment may be reoxidized by the residual NO 94 in the anneal step. For preventing this, the following third treatment is performed to remove NO 94.

That is, as shown in FIG. 10B, by performing the third treatment of at least any one of irradiation of rare gas ions and irradiation of rare gas plasma and heating, the residual NO 94 can be removed. The removed NO 94 from the insulating layer 161 and the conductive portion 162 is exhausted through the space of the treatment chamber in which the third treatment is performed to the outside of the treatment chamber.

Thus, by removing the residual NO 94 from the insulating layer 161 and the conductive portion 162, the amount of the oxygen impurities is decreased and the electric characteristics is stabilized. Moreover, this prevents oxidization the surrounding pinned layer 14 or the free layer 18 or the bottom metallic layer 15 and the top metallic layer 17 in the extended spacer layer 16s. The oxidation of these layers not only makes increase of the specific resistance and decrease of the MR variation ratio but also decreases the adhesive force with the spacer layer 16 (CCP-NOL layer). Therefore, by removing NO 94, the effect of lowering the surrounding resistance and improving the adhesive force can also be expected.

Moreover, by the third treatment of at least any one of irradiation of rare gas ion and irradiation of rare gas plasma and heating, for example, crystallinity of the conductive portion 162 is improved and the resistance thereof is further decreased. Thereby, the MR variation ratio can be further improved.

As described above, for example, by heating the insulating layer 161 and the conductive portion 162 in the second treatment, the third treatment can be omitted. Also, for example, even when the insulating layer 161 and the conductive portion 162 are heated in the second treatment, if the removal of NO 94 is insufficient, the third treatment may be performed to promote the removal of NO 94.

Furthermore, in the third treatment, as the Ar ion beam is stronger and as the irradiation time is longer, the effect of removing NO 94 can be more obtained. However, if the Ar ion beam is strengthened or the irradiation time is prolonged, the spacer layer 16 is broken because of being thin. Accordingly, it is necessary to form the spacer layer 16 (CCP-NOL layer) having a resistivity with respect to the Ar ion beam as much as possible. Under such a circumstance, it can be thought that it exerts the effects to improve the resistivity to form the spacer layer 16 (CCP-NOL layer) to be thick by stacking a plurality of layers such as two layers or three layers. From such a consideration, it is thought that it is also effective to form the spacer layer 16 (CCP-NOL layer) in which four layers or more are stacked.

Figure 11:
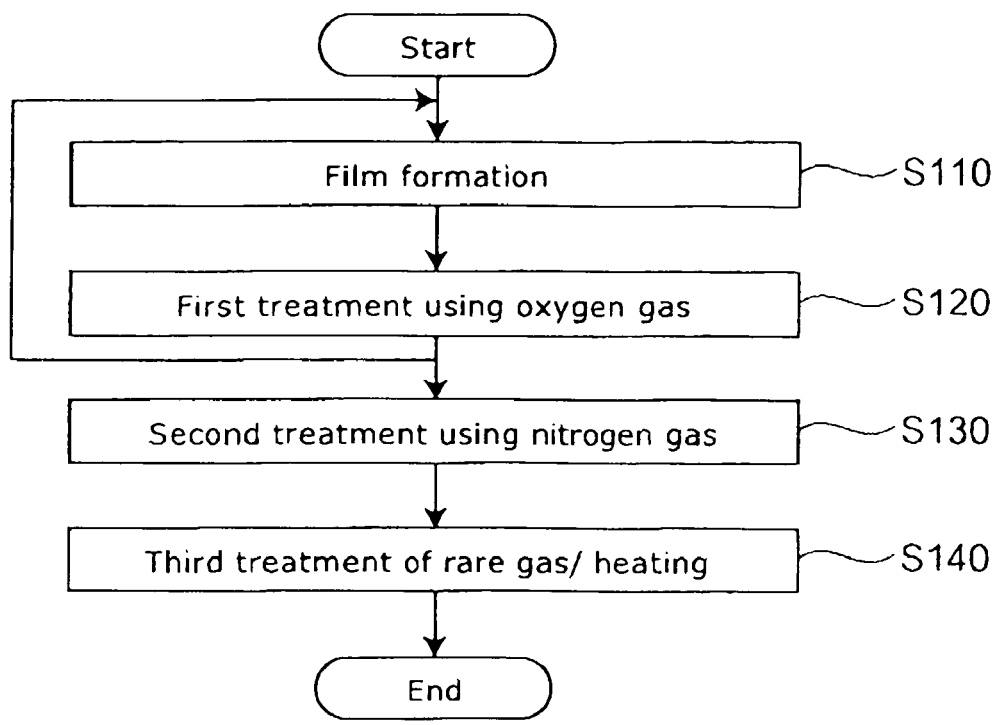
FIG. 11 is a flow chart illustrating another method for manufacturing according to the second embodiment of this invention.

FIG. 11 is a flow chart illustrating another method for manufacturing a magneto-resistance effect element according to the second embodiment of this invention.

As shown in FIG. 11, in this specific example, Step S110 to Step S120 are repeated. That is, a spacer layer 16 having a plurality of laminated structures is formed and then the second treatment and third treatment is performed. As described above, in the method for manufacturing a magneto-resistance effect element according to this embodiment, Step S110 to Step S120 may be repeated plural times and performed.

Also in this case, the second step (Step S120) may include the PIT step (Step S120a illustrated in FIG. 3) and the IAO step (Step S120b illustrated in FIG. 3).

Figure 12:
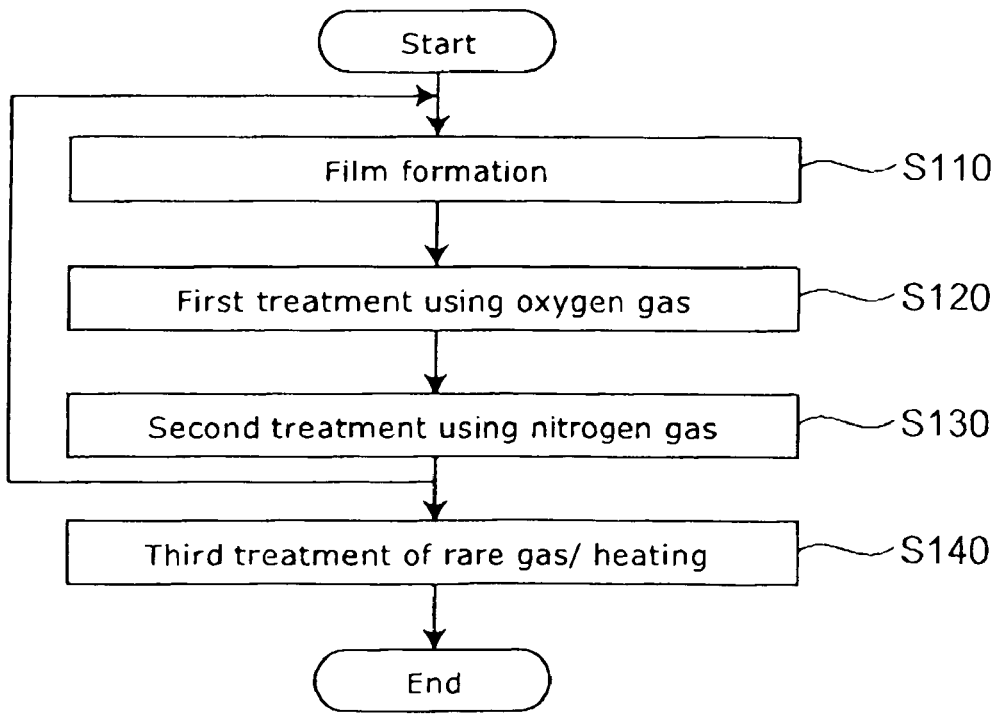
FIG. 12 is a flow chart illustrating another method for manufacturing according to the second embodiment of this invention.

FIG. 12 is a flow chart illustrating another method for manufacturing a magneto-resistance effect element according to the second embodiment of this invention.

As shown in FIG. 12, in the method for manufacturing another magneto-resistance effect element according to the second embodiment of this invention, the spacer layer 16 having two-layer structure by repeating Step S110 to Step S130, which has been described by using FIGS. 7 and 8, is submitted to the third treatment. By repeating the oxidation treatment and the reduction treatment, the region 161 where the oxidation is insufficient can be converted into the nitrided region 161n more easily. And, the second metallic film 16b, which is easy to be oxidized, is more oxidized, and the first metallic film 16a and the conductive portion 162, which are easy to be reduced, are more reduced. That is, the difference of oxidation energies between the materials can be emphasized and utilized. Thereby, by reducing the conductive portion 162, decreasing further the amount of the oxygen impurities and decreasing further the specific resistance of the conductive portion 162 while keeping the insulating performance of the insulating layer 161, the magneto-resistance effect element having a high reliability and a high MR variation ratio can be obtained.

Also in this case, the second step (Step S120) may include the PIT step (Step S120a illustrated FIG. 3) and the IAO step (Step S120b illustrated FIG. 3).

Figure 13:
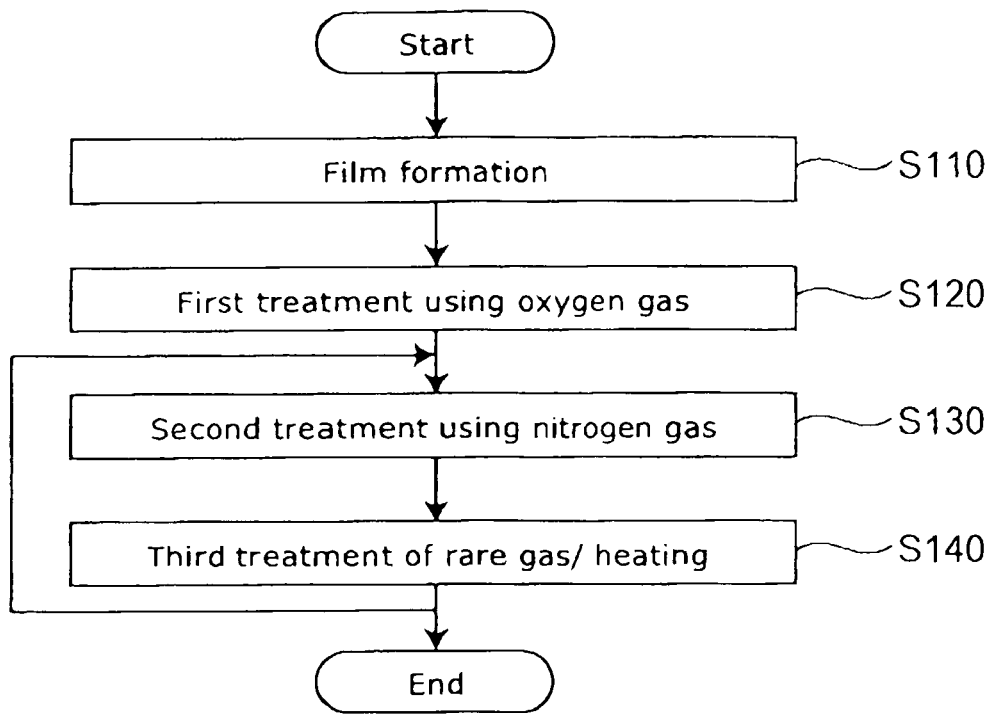
FIG. 13 is a flow chart illustrating another method for manufacturing according to the second embodiment of this invention.

FIG. 13 is a flow chart illustrating another method for manufacturing a magneto-resistance effect element according to the second embodiment of this invention.

As shown in FIG. 13, in another method for manufacturing the magneto-resistance effect element according to the second embodiment of this invention, Step S130 to Step S140 are repeated. This is for removing extra NO 94 before a large amount of the NO is accumulated, by repeating the second step (reduction treatment) and the third treatment (subsequent removal of NO 94). By performing the third treatment before the large amount is accumulated, the third treatment can have a weak condition. Specifically, when the third treatment is Ar plasma irradiation, if irradiation is repeated twice, RF power is sufficient to be half of that of the case of one-time irradiation. Or, the time may be about half. Anyway, the damage provided to the insulating layer 161 and the conductive portion 162 in the third treatment is suppressed, and the insulating layer 161 with a higher dense and the conductive portion 162 with a higher purity are formed and the MR variation ratio is improved.

Also in this case, the second step (Step S120) may include the PIT step (Step S120a illustrated FIG. 3) and the IAO step (Step S120b illustrated FIG. 3).

Figure 14:
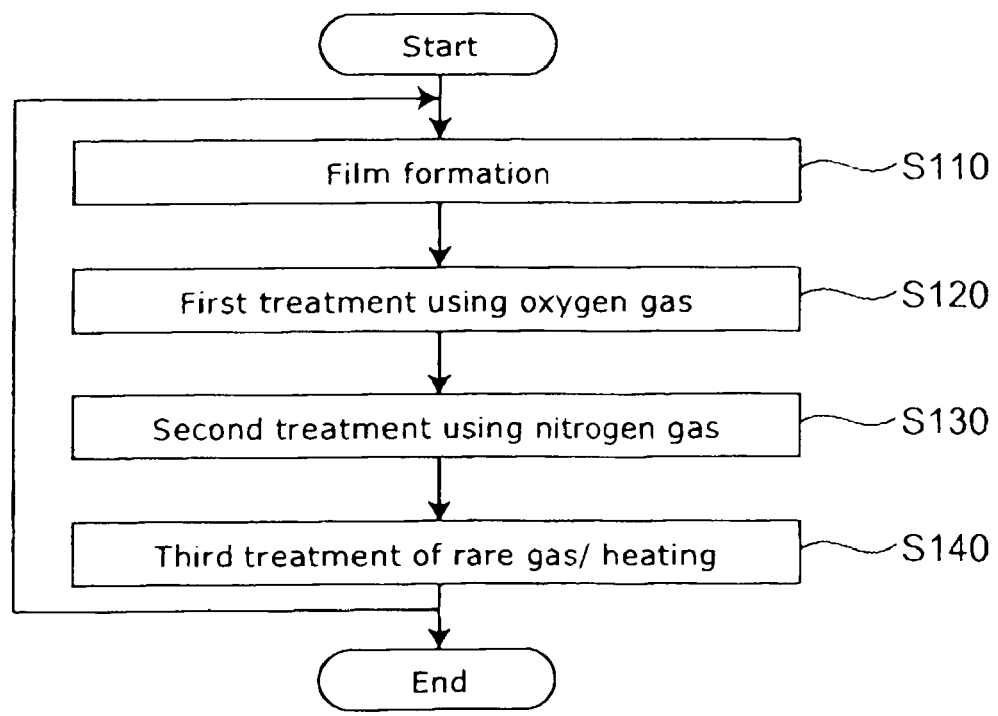
FIG. 14 is a flow chart illustrating another method for manufacturing according to the second embodiment of this invention.

FIG. 14 is a flow chart illustrating another method for manufacturing a magneto-resistance effect element according to the second embodiment of this invention.

As shown in FIG. 14, in another method for manufacturing a magneto-resistance effect element according to the second embodiment of this invention, Step S110 to Step S140 are repeated. That is, the spacer layer 16 having a plurality of structures is formed, and the third treatment is performed in each of the treatments.

Also in this case, the second step (Step S120) may include the PIT step (Step S120a illustrated FIG. 3) and the IAO step (Step S120b illustrated FIG. 3).

The effects of the second treatment and the third treatment become weaker as the position is deeper in the direction of the film thickness. That is, when the spacer layer 16 is formed by repeating Step S110 to Step S120 three times, CuO reduction and NO 94 removal can be realized and in addition, crystallinity improvement of the conductive portion 162 can be expected in the upper portion of the spacer layer 16, but in the lower portion of the spacer layer 16, occasionally, the degree of CuO reduction is relatively low and the residual amount of NO 94 is relatively large and the crystallinity is also relatively degraded. Accordingly, by repeating Step S110 to Step S140, the characteristics are improved. That is, the rather thin insulating layer 161 and conductive portion 162 are submitted to the second treatment (Step S130) and the third treatment (Step S140), and thereby, CuO is sufficiently reduced and NO 94 is removed, and the crystallinity of the conductive portion 162 is improved. Then, moreover, the rather thin insulating layer 161 and conductive portion 162 are formed and submitted to the second treatment (Step S130) and the third treatment (Step S140), and thereby, CuO is sufficiently reduced and NO 94 is removed and the crystallinity of the conductive portion 162 is improved.

As described above, according to the method for manufacturing a magneto-resistance effect element of this specific example, the spacer layer 16 is formed plural times to ensure high reliability, and the residue of oxygen generated in this process in the conductive portion 162 is effectively suppressed, and furthermore, the residual NO 94 is removed and the crystallinity is also improved, and the magneto-resistance effect element having high MR variation ratio can be obtained.

FIG. 15 is a flow chart illustrating another method for manufacturing a magneto-resistance effect element according to the second embodiment of this invention.

As shown in FIG. 15, another method for manufacturing a magneto-resistance effect element according to the second embodiment of this invention, after the first step (Step S110), the second step (Step S120), the third step (Step S130) and fourth step (Step S140), which are explained with respect to FIG. 10, further a fifth step (Step S150) is carried out.

In some cases, after the fourth step, the insulator part of the spacer layer 16 (CCP-NOL layer) may be slightly reduced and the voltage-robustness may be decreased. By performing the fifth step (Step S150), an amount of oxygen in the insulator part of the spacer layer 16 is increased again and the voltage-robustness can be recovered. The oxidation condition of the fifth step (Step S150) may be selected substantially not to oxidize the metal which forms mainly the spacer layer 16.

In the fifth step, the film submitted to the third treatment is submitted to the fourth treatment of at least using a gas including at least one of oxygen molecules, oxygen atoms, oxygen ions, oxygen plasma and oxygen radicals to the film, the film submitted to the third treatment. In the fourth treatment, the film is oxidized.

Thus, the method further includes performing a fourth treatment using a gas including at least one of oxygen molecules, oxygen atoms, oxygen ions, oxygen plasma and oxygen radicals to the film, the film submitted to the third treatment.

In the method for manufacturing a magneto-resistance effect element according to the embodiments of this invention, an apparatus described below can be used.

FIG. 16 is a schematic view illustrating a configuration of a manufacturing apparatus used for the method for manufacturing a magneto-resistance effect element according to the embodiments of this invention.

As shown in FIG. 16, in the manufacturing apparatus 50a used for the method for manufacturing a magneto-resistance effect element according to the embodiments of this invention, the transfer chamber (TC) 50 is disposed at the center of the apparatus such that the first chamber (the load lock chamber) 51, the second chamber 52, the third chamber 53, the forth chamber and the fifth chamber 55 are disposed so as to be connected with the transfer chamber 50 via the gate valves, respectively. In this manufacturing apparatus 50a, forming films and various treatments are performed. In the apparatus, the substrate on which various films are to be formed is transferred from one chamber to another chamber under the vacuum condition via the corresponding gate valve. Therefore, the surface of the substrate can be maintained clean.

In the second chamber 52, for example, the exposure to the nitrogen gas 93g (including nitrogen ions and nitrogen plasma), the irradiation of nitrogen ion 93i and nitrogen plasma are performed. That is, the second treatment is preformed. Moreover, the irradiation of ions of rare gas ions and rare gas plasma may be performed. That is, the third treatment is performed. The second chamber 52 may includes a heating stage and the heating treatment in the second treatment and the third treatment can be performed.

In the third chamber 53, a pre-cleaning and the treatment with rare gas plasma are performed. In other words, the PIT treatment is performed, for example.

In the forth chamber 54, metallic films are formed.

In the fifth chamber 55, oxide layers are formed. Nitride layers can be formed in the fifth chamber 55.

The forth chambers 54 may include a plurality of targets (five to ten targets) which is called as a multi-structured target. As the film forming means, a sputtering method such as a DC magnetron sputtering or an RF magnetron sputtering, an ion beam sputtering, a vacuum deposition, a CVD (Chemical Vapor Deposition) or an MBE (Molecular Beam Epitaxy) can be employed.

When a Strengthen Adhesion Treatment (SAT) is performed for the spacer layer 16, the SAT is performed in a chamber having RF plasma mechanism, ion beam mechanism or heating mechanism. More specifically, the forth chamber 54 or the second chamber 52 having a RF plasma mechanism. Since the RF plasma mechanism has a simplified mechanism, by using the forth chambers 54, both of the metallic film formation and the SAT can be performed.

Herein, it is not desired that the SAT is performed in the fifth chamber 55. In this case, the oxygen gas absorbed onto the inner wall of the oxidation chamber is released to contaminate the free layer 18 so that the free layer 18 may be deteriorated. In a chamber as the forth chamber 54, since the oxygen gas is not absorbed onto the inner wall of the chamber because the oxygen gas is not used at the film-forming process, the vacuum condition of the chamber can be easily maintained.

The pressure in the above-described vacuum chamber is in the order of $10^{-9}$ Torr, and the allowable pressure range is the order of $5 \times 10^{-8}$ Torr or below.

Figure 17:
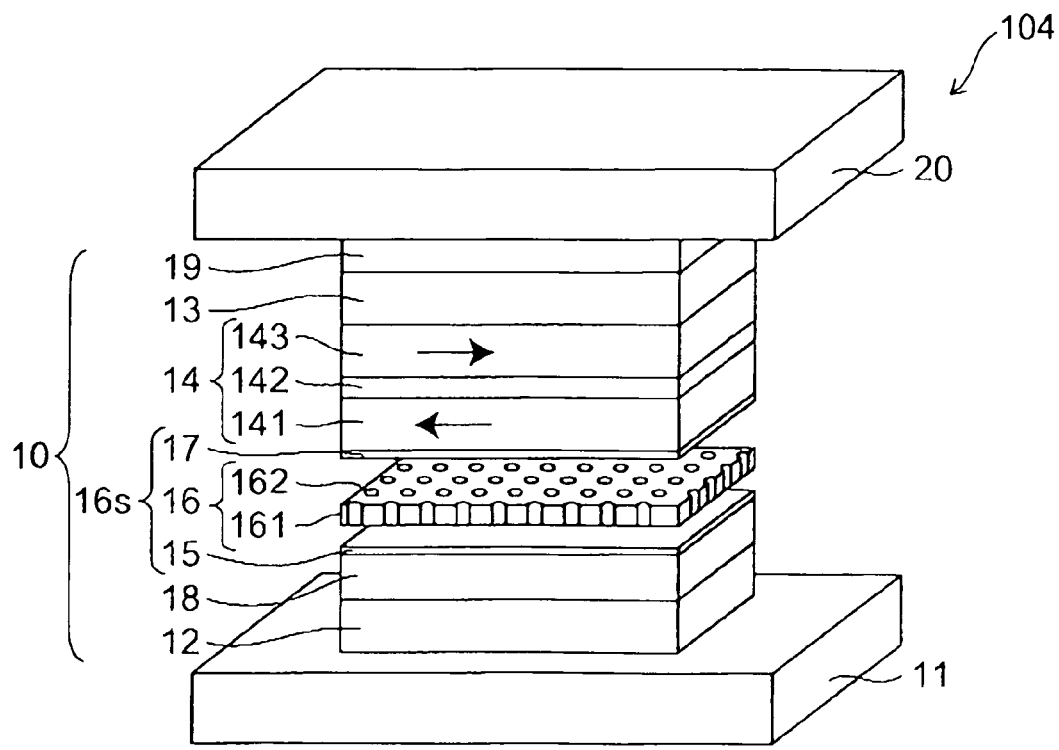
FIG. 17 is a schematic perspective view illustrating a configuration of another magneto-resistance effect element to which the method for manufacturing according to the embodiments of this invention is applied.

FIG. 17 is a schematic perspective view illustrating a configuration of another magneto-resistance effect element to which the method for manufacturing a magneto-resistance effect element according to the embodiments of this invention is applied.

As shown in FIG. 17, another magneto-resistance effect element 104 to which the method for manufacturing a magneto-resistance effect element according to the embodiments of this invention is applied, is a top-type CCP-CPP element in which the pinned layer 14 is located above the free layer 18. The method for manufacturing a magneto-resistance effect element according to the first and the second embodiments can also be applied to the top-type CCP-CPP element, as well as the bottom-type CCP-CPP (such as magneto-resistance effect element 101) in which the pinned layer 14 is located below the free layer 18, and the same effect can be obtained.

Third Embodiment

The magneto-resistance effect element 105 (not shown) according to a fourth embodiment of this invention is any one of the magneto-resistance effect elements (CCP elements) produced by the method for manufacturing a magneto-resistance effect element of the first and the second embodiments. That is, the magneto-resistance effect element 105 includes the above-described magneto-resistance effect elements 101 and 104.

In the embodiment of the present invention, in view of high density recording, the element resistance RA is set preferably to 500 m$\Omega$/$\mu$m$^2$ or below, more preferably to 300 m$\Omega$/$\mu$m$^2$ or below. In the calculation of the element resistance RA, the effective area A in current flow of the spin valve film is multiplied to the resistance R of the CPP-CPP element. Herein, the element resistance R can be directly measured, but attention should be paid to the effective area A because the effective area A depends on the element structure.

If the whole area of the spin valve film is effectively sensed by current through patterning, the whole area of the spin valve film corresponds to the effective area A. In this case, the whole area of the spin valve film is set to 0.04 $\mu$m$^2$ or below in view of the appropriate element resistance, and to 0.02 $\mu$m$^2$ or below in view of the recording density of 300 Gbpsi or over.

If the area of the bottom electrode 11 or the top electrode 20 is set smaller than the whole area of the spin valve film, the area of the bottom electrode 11 or the top electrode 20 corresponds to the effective area A. If the area of the bottom electrode 11 is different from the area of the top electrode 20, the smaller area of either of the bottom electrode 11 or the top electrode 20 corresponds to the effective area A. As described above, the smaller area is set to 0.04 $\mu$m$^2$ or below in view of the appropriate element resistance Referring to FIGS. 17 and 18 since the smallest area of the magneto-resistance effect film 10 in the magneto-resistance effect element 105 corresponds to the contacting area with the top electrode 20 as apparent from FIG. 18, the width of the smallest area can be considered as a track width Tw. Then, since the smallest area of the magneto-resistance effect films 10 in MR height direction also corresponds to the contacting area with the top electrode 20 as apparent from FIG. 28, the width of the smallest are can be considered as a height length D. In this case, the effective area A of the spin valve film can be calculated on the equation of A=Tw×D.

In the magneto-resistance effect element 105 according to the embodiments of this invention, the resistance R between the electrodes can be reduced to 100$\Omega$ or below, which corresponds to the resistance between the electrode pads in the reproducing head attached to the forefront of a head gimbal assembly (HGA, that is magnetic head assembly), for example.

In the magneto-resistance effect element 105 according to the embodiments of this invention, it is desired that the magneto-resistance effect element is structured in fcc (111) orientation when the pinned layer 14 or the free layer 18 has the fcc-structure. It is also desired that the magneto-resistance effect element is structured in bcc (100) orientation when the pinned layer 14 or the free layer 18 has the bcc-structure. It is also desired that the magneto-resistance effect element is structured in hcp (001) orientation when the pinned layer 14 or the free layer 18 has the hcp-structure.

The crystalline orientation of the magneto-resistance effect element 105 according to the embodiments of this invention, is preferably 4.0 degrees or below, more preferably 3.5 degrees or below and particularly 3.0 degree or below in view of the dispersion of orientation. The crystalline orientation can be measured from the FWHM of X-ray rocking curve obtained from the θ-2θ measurement in X-ray diffraction. The crystalline orientation can be also measured by the spot scattering angle originated from the nano-diffraction spots of the element cross section.

Depending on the kind of material of the antiferromagnetic film, since the lattice spacing of the antiferromagnetic film is different from the lattice spacing of the pinned layer 14/spacer layer 16/free layer 18, the dispersion in crystalline orientation can be obtained between the antiferromagnetic film and the pinned layer 14/spacer layer 16/free layer 18. For example, the lattice spacing of the PtMn antiferromagnetic layer is often different from the lattice spacing of the pinned layer 14/spacer layer 16/free layer 18. In this point of view, since the PtMn layer is formed thicker, the PtMn layer is suitable for the measurement in dispersion of the crystal orientation. With the pinned layer 14/spacer layer 16/free layer 18, the pinned layer 14 and the free layer 18 may have the respective different crystal structures of bcc-structure and fcc-structure. In this case, the dispersion angle in crystal orientation of the pinned layer 14 may be different from the dispersion angle in crystal orientation of the free layer 18.

Figure 18:
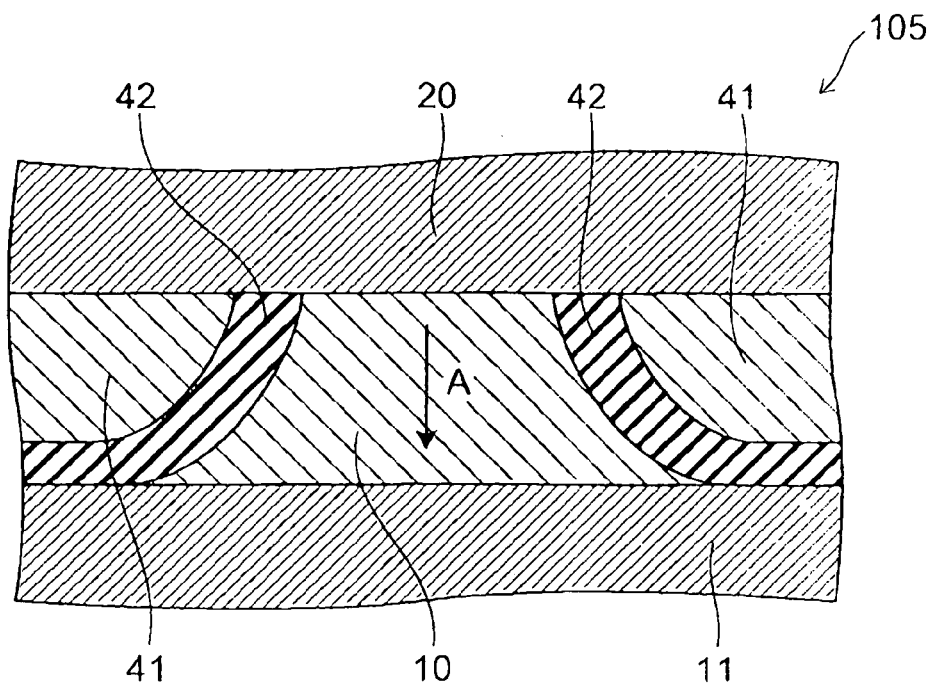
FIG. 18 is a schematic cross sectional view illustrating an application embodiment of the magneto-resistance effect element according to the embodiment of this invention.

FIGS. 17 and 18 are schematic cross sectional views illustrating application embodiments of the magneto-resistance effect element according to the embodiments of this invention.

Figure 19:
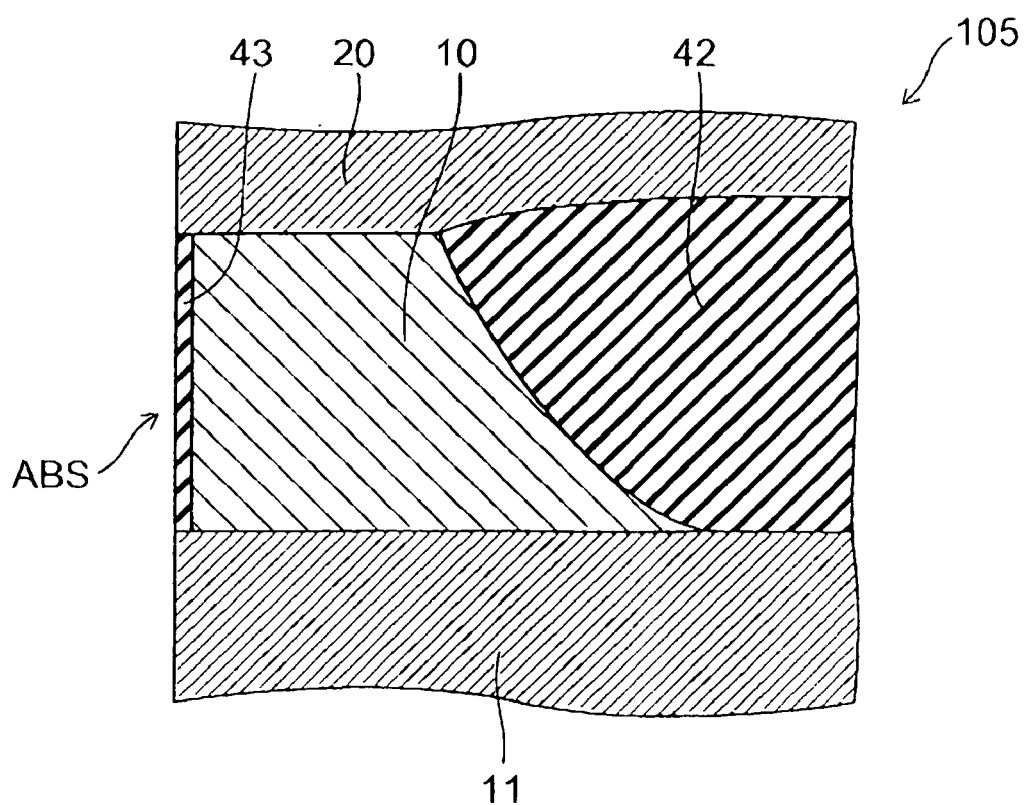
FIG. 19 is a schematic cross sectional view illustrating an application embodiment of the magneto-resistance effect element according to the embodiments of this invention.

More specifically, these figures illustrate the state where the magneto-resistance effect element 105 by using this embodiment is incorporated in a magnetic head. FIG. 18 is a cross sectional view showing the magneto-resistance effect element 105, taken on the surface almost parallel to the ABS (air bearing surface) opposite to a (not shown) magnetic recording medium. FIG. 19 is a cross sectional view showing the magneto-resistance effect element 105, taken on the surface perpendicular to the ABS.

The magnetic head shown in FIGS. 17 and 18 has a so-called hard abutted structure. The magneto-resistance effect element 105 is the CCP-CPP element as described above manufacture by any one of methods for manufacturing according to embodiments of this invention.

As shown in FIGS. 17 and 18, the bottom electrode 11 and the top electrode 20 are provided on the top surface and the bottom surface of the magneto-resistance effect film 10, respectively. The biasing magnetic applying films 41 and the insulating films 42 are formed at the both sides of the magneto-resistance effect film 10. As shown in FIG. 19, the protective layer 43 is formed on the ABS of the magneto-resistance effect film 10.

The sense current is flowed along the arrow A through the magneto-resistance effect film 10 between the bottom electrode 11 and the top electrode 20, that is, in the direction perpendicular to the film surface of the magneto-resistance effect film 10. Moreover, a given biasing magnetic field is applied to the magneto-resistance effect film 10 from the biasing magnetic field applying films 41 so as to render the domain structure of the free layer 18 of the film 10 a single domain structure through the control of the magnetic anisotropy of the free layer 18 and stabilize the magnetic domain structure of the free layer 18. In this case, the Barkhausen noise due to the shift of magnetic wall in the magneto-resistance effect film 10 can be prevented. Since the S/N ratio of the magneto-resistance effect film 10 is enhanced, the magnetic head including the magneto-resistance effect film 10 can realize the high sensitive magnetic reproduction.

Fourth Embodiment

Figure 20:
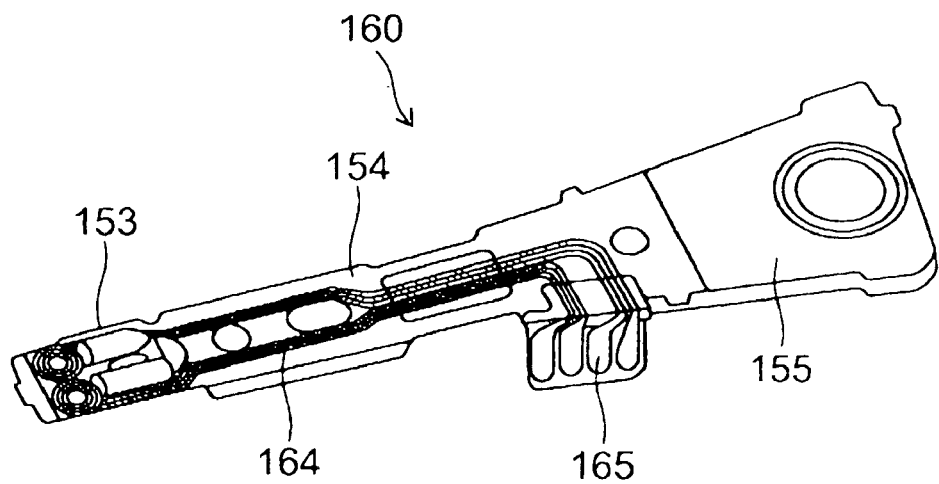
FIG. 20 is a schematic perspective view illustrating a configuration of magnetic head assembly according to the fourth embodiment of this invention.

FIG. 20 is a schematic perspective view illustrating a configuration of magnetic head assembly according to the fourth embodiment of this invention.

As shown in FIG. 20, a magnetic head assembly (head gimbal assembly) 160 according to a fourth embodiment of this invention includes a suspension 154 in which the magneto-resistance effect element according to the embodiments of this invention is mounted at one end thereof and an actuator arm 155 connected to the other end of the suspension 154. Here, the magneto-resistance effect element is at least any one of the above-described magneto-resistance effect elements 101, 104, and 105.

That is, the head gimbal assembly 160 has the actuator arm 155, and the suspension 154 is connected to one end of the actuator arm 155. To the forefront of the suspension 154, a head slider having a magnetic head including the magneto-resistance effect element according to the embodiment of this invention is attached.

The suspension 154 has lead wires 164 for writing and reading of a signal, and the lead wire 164 and each of electrodes of the magnetic head incorporated into the head slider 153 are electrically connected. In the head gimbal assembly 160, an electrode pad 165 is provided.

The magnetic resistance head assembly according to this embodiment has a magnetic head including a magneto-resistance effect element manufactured by any one of the methods for manufacturing a magneto-resistance effect element according to the first and the second embodiments, and therefore, the magnetic head assembly having high MR variation ratio can be provided.

Fifth Embodiment

Figure 21:
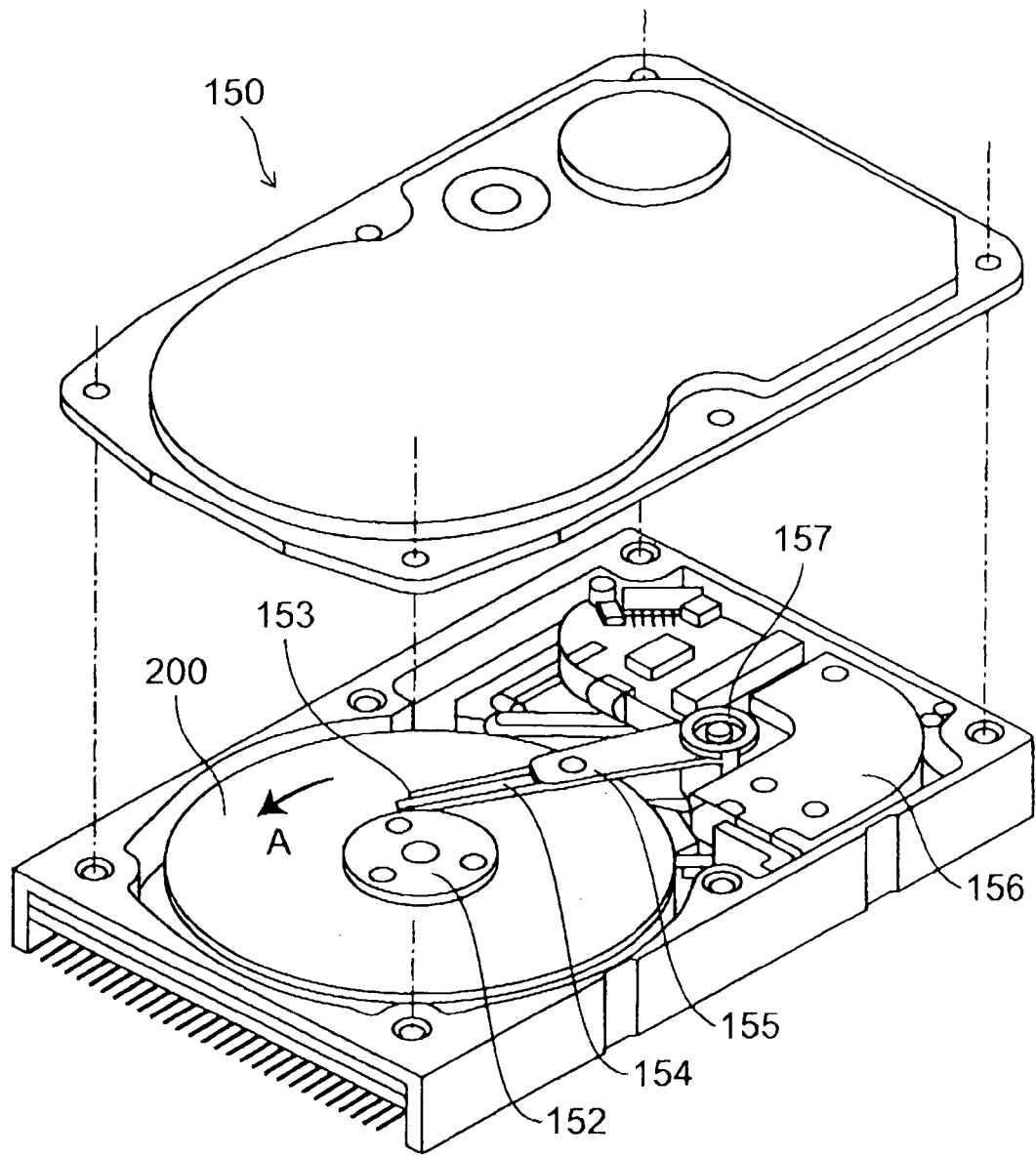
FIG. 21 is a schematic perspective view illustrating a configuration of a magnetic recording and reproducing apparatus of a fifth embodiment of this invention.

FIG. 21 is a schematic perspective view illustrating a configuration of a magnetic recording and reproducing apparatus of a fifth embodiment of this invention.

As shown in FIG. 21, a magnetic recording and reproducing apparatus 150 according to the fifth embodiment of this invention is an apparatus having a type of using a rotary actuator. In this figure, a magnetic disk 200 is loaded in a spindle motor 152, and rotates to the direction of the arrow A by a motor, which is not shown, responding to a control signal from a drive apparatus control part, which is not shown. The magnetic recording and reproducing apparatus 150 according to this embodiment may have a plurality of magnetic disks 200.

The magnetic recording and reproducing apparatus 150 includes the above-described magnetic head assembly 160 according to this invention.

That is, the head slider 153 housed in the magnetic disc 200 and performing recording and reproducing of information is attached to the forefront of the thin-filmy suspension 154.

The suspension 154 is connected to one edge of the actuator arm 155. A voice coil motor 156 being a kind of a linear motor is provided at the other edge of the actuator arm 155. The voice coil motor 156 is composed of the driving coil (not shown) wound around the bobbin portion and a magnetic circuit with a permanent magnet and a counter yoke which are disposed opposite to one another so as to sandwich the driving coil.

When the magnetic recording disk 200 is rotated, the air bearing (ABS) of the head slider 153 is held above the main surface of the magnetic recording disk 200 with a given floating distance. Alternatively, the head slider 153 may constitute a so-called "contact running type" slider such that the slider is in contact with the magnetic recording disk 200.

The actuator arm 155 is supported by ball bearings (not shown) provided at the upper portion and the bottom portion of the spindle 157 so as to be rotated and slid freely by the voice coil motor 156.

In the magnetic recording and reproducing apparatus 150 according to this embodiment, the head gimbal assembly 160 having a magnetic head including the above-described magneto-resistance effect element manufactured by at least any one of the first and the second embodiments of this invention is used, and therefore, by the high MR variation ratio, information magnetically recorded in the magnetic disk 200 with high recording density can be certainly read.

Sixth Embodiment

Next, as a magnetic recording and reproducing apparatus according to a sixth embodiment of this invention, an example of magnetic memory in which the magneto-resistance effect element according to the embodiment of this invention is mounted will be described. That is, by using the magneto-resistance effect element according to the embodiment of this invention, a magnetic memory such as magnetic random access memory (MRAM) in which a memory cell is arranged in a matrix form can be realized. Hereinafter, the case in which the magneto-resistance effect element 101 explained in the first embodiment is used as the magneto-resistance effect element will be described, but at least any one of the above-described magneto-resistance effect elements 101, 104, and 105 explained as the embodiments and examples of this invention can be used.

Figure 22:
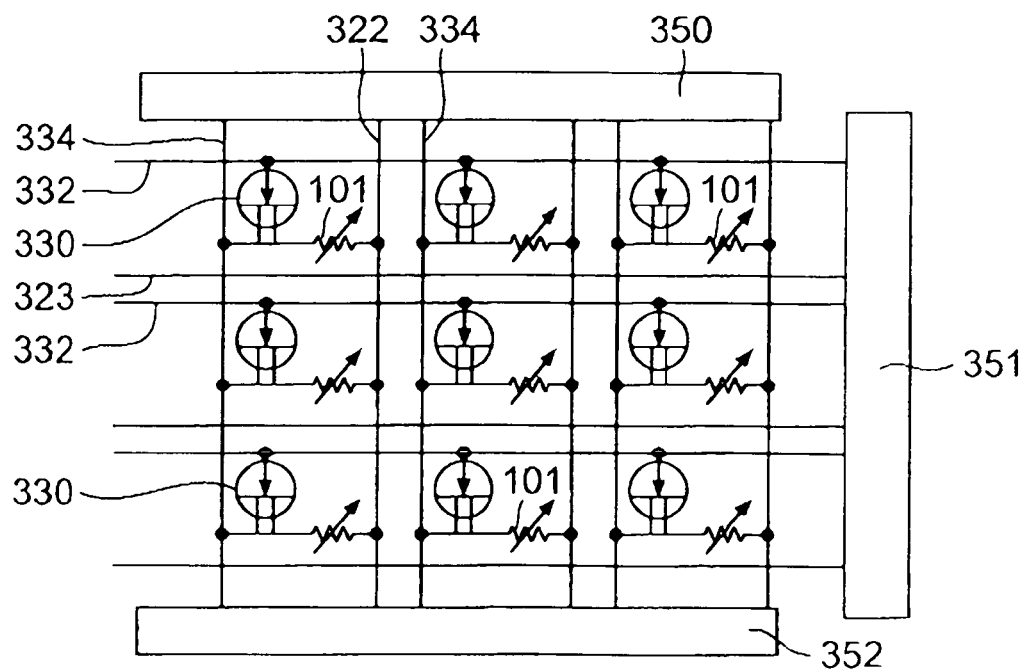
FIG. 22 is a schematic view illustrating a configuration of a magnetic recording and reproducing apparatus according to a sixth embodiment of this invention.

FIG. 22 is a schematic view illustrating a configuration of a magnetic recording and reproducing apparatus according to a sixth embodiment of this invention.

This drawing shows a circuit configuration when the memory cells are arranged in an array.

As shown in FIG. 22, in the magneto-resistance effect element according to the embodiment of this invention, in order to select one bit in the array, a column decoder 350 and a line decoder 351 are provided, where a switching transistor 330 is turned ON by a bit line 334 and a word line 332 and to be selected uniquely, so that the bit information recorded in a magnetic recording layer (free layer) in the magneto-resistance effect film 10 can be readout by being detected by a sense amplifier 352.

In order to write the bit information, a writing current is flowed in a specific write word line 323 and a bit line 322 to generate a magnetic field for writing.

Figure 23:
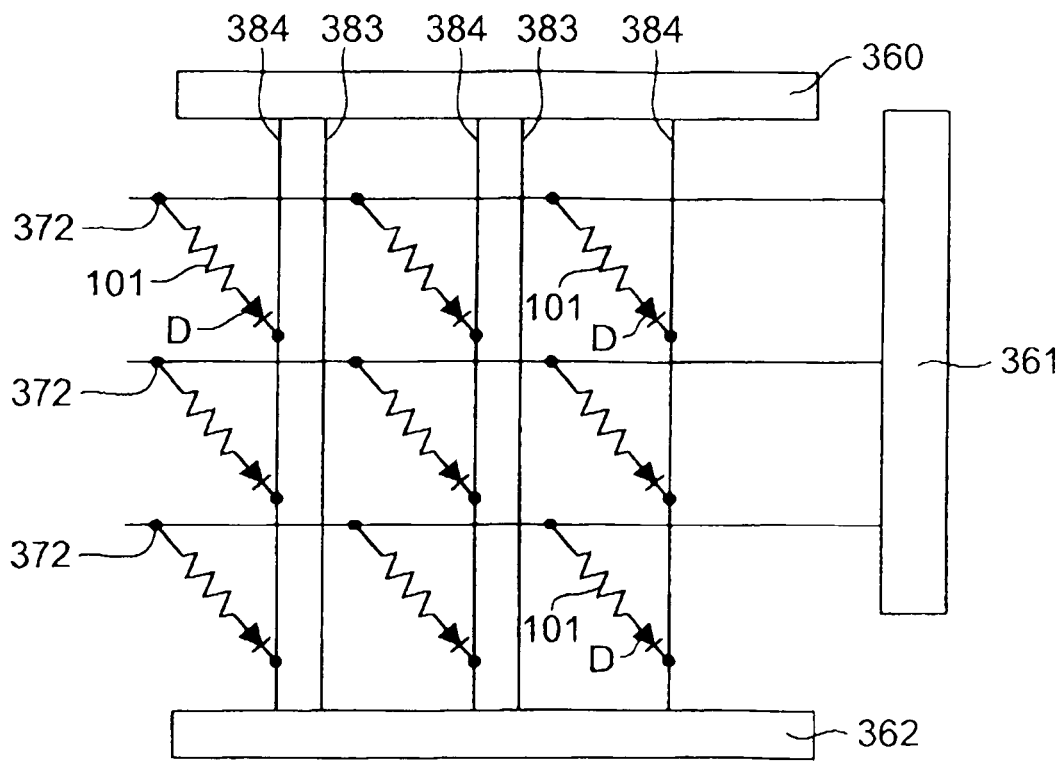
FIG. 23 is a schematic view illustrating a configuration of another magnetic recording and reproducing apparatus according to a sixth embodiment of this invention.

FIG. 23 is a schematic view illustrating a configuration of another magnetic recording and reproducing apparatus according to a sixth embodiment of this invention.

As shown in FIG. 23, in this case, a bit line 372 and a word line 384 which are arranged in matrix are selected by decoders 360, 361 and 362 respectively, so that a specific memory cell in the array is selected. Each memory cell is configured such that the magneto-resistance effect element 101 and a diode D are connected in series. Here, the diode D plays a role of preventing a sense current from detouring in the memory cell other than the selected magneto-resistance effect element 101. A writing is performed by a magnetic field generated by flowing the writing current in the specific bit line 372 and the word line 383, respectively.

Figure 24:
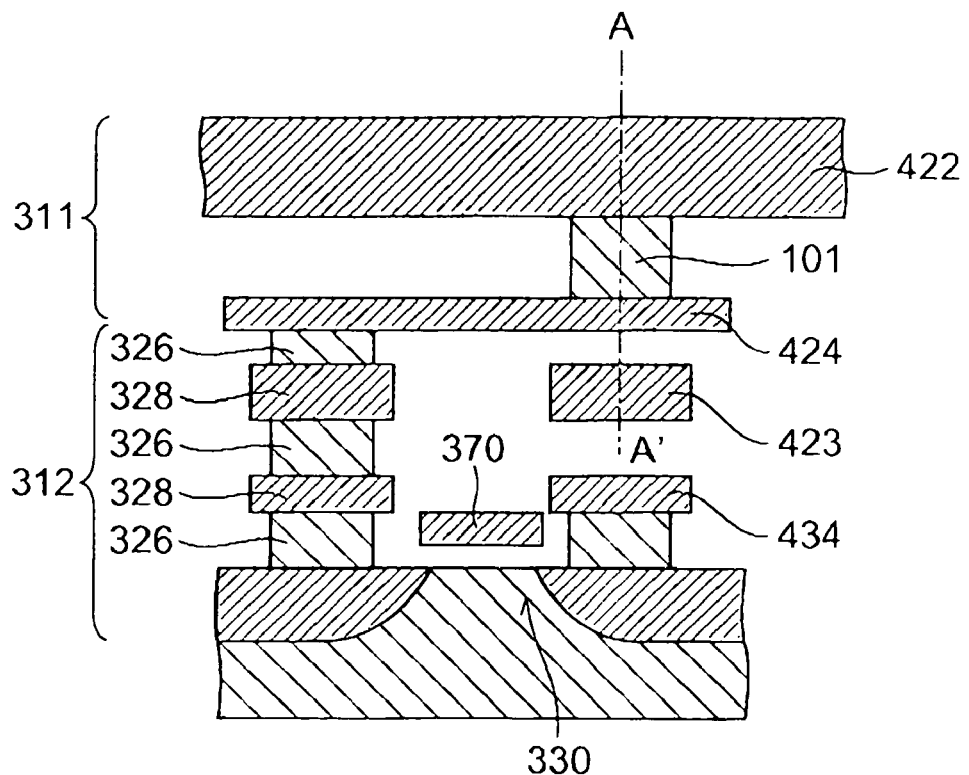
FIG. 24 is a schematic view illustrating a configuration of another magnetic recording and reproducing apparatus according to a sixth embodiment of this invention.

FIG. 24 is a schematic view illustrating a configuration of another magnetic recording and reproducing apparatus according to a sixth embodiment of this invention.

Figure 25:
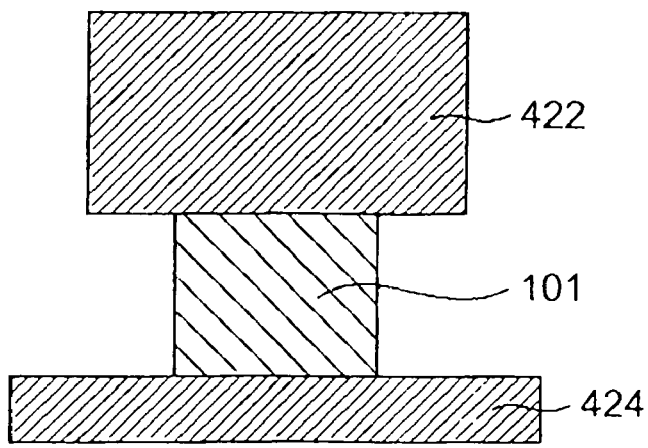
FIG. 25 is a schematic cross-sectional view taken on A-A' line shown in FIG. 24.

FIG. 25 is a schematic cross-sectional view taken on A-A' line shown in FIG. 24.

These figures illustrate a configuration of a 1-bit memory cell included in the magnetic recording and reproducing apparatus (the magnetic memory) shown in FIG. 22. This memory cell includes a memory element part 311 and an address selection transistor part 312.

The memory element part 311 includes the magneto-resistance effect element 101 and a pair of wirings 422, 424 connected to the magneto-resistance effect element 101. The magneto-resistance effect element 101 is the magneto-resistance effect element (CCP-CPP element) as described in the above embodiments.

Meanwhile, in the address selection transistor part 312, a switching transistor 330 having connection therewith via a via 326 and an embedded wiring 328 is provided. The switching transistor 330 performs switching operations in accordance with voltages applied to a gate 370 to control the opening/closing of the current path between the magneto-resistance effect element 101 and the wiring 434.

Further, below the magneto-resistance effect element 101, a wire 423 for writing is provided in the direction that is about perpendicular to the wire 422. These wires 422 and 423 can be formed by aluminum (Al), copper (Cu), tungsten (W), tantalum (Ta) or an alloy including any one thereof.

The above-described wire 422 corresponds to the bit line and the wire 423 corresponds to the word line 323.

In the memory cell having such a configuration, when writing bit information into the magneto-resistance effect element 101, a writing pulse current is flowed in the wirings 422 and 423, and a synthetic magnetic field induced by the writing current is applied to appropriately invert the magnetization of a recording layer of the magneto-resistance effect element 101.

Further, when reading out the bit information, a sense current is flowed through the wiring 422, the magneto-resistance effect element 101 including the magnetic recording layer and the wiring 424 to measure a resistance value of or a fluctuation in the resistance values of the magneto-resistance effect element 101.

The magnetic memory according to the embodiment of this invention can assure writing and reading by surely controlling the magnetic domain of the recording layer even though the cell is miniaturized in size, with the use of the magneto-resistance effect element (CCP-CPP element) with the above-described embodiment.

This invention is not limited to the above disclosure and every kind of variation and modification may be made without departing from the scope of the present invention. The concrete structure of the magneto-resistance effect element, and the shape and material of the electrodes, the magnetic field biasing films and the insulating layer can be appropriately selected among the ones well known by the person skilled in the art. In these cases, the intended magneto-resistance effect element by using the present invention can be obtained so as to exhibit the same effect/function as described above. When the magneto-resistance effect element is applied for a reproducing magnetic head, the detecting resolution of the magnetic head can be defined by applying magnetic shielding for the upper side and the lower side of the magneto-resistance effect element.

Moreover, the magneto-resistance effect element can be applied for both of a longitudinal magnetic recording type magnetic head and a vertical magnetic recording type magnetic recording type magnetic head. Also, the magneto-resistance effect element can be applied for both of a longitudinal magnetic recording/reproducing device and a vertical magnetic recording/reproducing device. The magnetic recording/reproducing device may be a so-called stationary type magnetic device where a specific recording medium is installed therein or a so-called removable type magnetic device where a recording medium can be replaced.

As described above, the embodiments of the invention have been described with reference to specific examples. However, the invention is not limited to these specific examples. For example, the specific configuration of each of components constituting the method for manufacturing a magneto-resistance effect element and the magnetic recording and reproducing apparatus are included in the scope of the invention, as long as the invention can be carried out in the same manner and the same effect can be obtained by appropriately selecting the components from the known range by those skilled in the art.

Moreover, combination of two or more components of each of the specific examples in the technically possible range is included in the scope of the invention as long as including the spirit of the invention.

In addition, all of the method for manufacturing a magneto-resistance effect element and the magnetic recording and reproducing apparatus that can be appropriately design-modified and carried out by those skilled in the art on the basis of the method for manufacturing a magneto-resistance effect element and the magnetic recording and reproducing apparatus described above as the embodiments of the invention belong to the invention as long as including the spirit of the invention.

In addition, it is understood that those skilled in the art can achieve various variations and modifications and modifications and that the variations and the modifications belong to the scope of the invention.

The invention claimed is:

1. A method for manufacturing a magneto-resistance effect element having a first magnetic layer including a ferromagnetic material, a second magnetic layer including a ferromagnetic material and a spacer layer provided between the first magnetic layer and the second magnetic layer, the spacer layer having an insulating layer and a conductive portion penetrating through the insulating layer, the method comprising:

forming a film to be a base material of the spacer layer;
performing a first treatment using a gas including at least one of oxygen molecules, oxygen atoms, oxygen ions, oxygen plasma and oxygen radicals on the film; and
performing a second treatment using a gas including at least one of nitrogen ions, nitrogen atoms, nitrogen plasma, and nitrogen radicals on the film submitted to the first treatment.

2. The method according to claim 1, wherein the second treatment includes a treatment of introducing nitrogen gas in an atmosphere achieved by ionizing or forming plasma of a gas including at least one of argon, Xenon, helium, neon and krypton.

3. The method according to claim 1, wherein the second treatment includes a treatment of irradiating the film with nitrogen gas ionized or formed into plasma, the film being submitted to the first treatment.

4. The method according to claim 1, wherein the second treatment is performed while heating the film submitted to the first treatment.

5. The method according to claim 1, further comprising: performing a third treatment including at least one of irradiating the film with rare gas ions, irradiating the film with rare gas plasma and heating the film, the film being submitted to the second treatment.

6. The method according to claim 5, wherein a combination of the performing the second treatment and the performing the third treatment is repeated plural times.

7. The method according to claim 5, wherein a combination of the forming the film, the performing the first treatment, the performing the second treatment and the performing the third treatment is repeated plural times.

8. The method according to claim 5, further comprising: performing a fourth treatment using a gas including at least one of oxygen molecules, oxygen atoms, oxygen ions, oxygen plasma and oxygen radicals to the film, the film being submitted to the third treatment.

9. The method according to claim 1, wherein a combination of the forming the film, the performing the first treatment and the performing the second treatment is repeated plural times.

10. The method according to claim 1, wherein a combination of the forming the film and the performing the first treatment is repeated plural times.

11. The method according to claim 1, wherein the forming the film includes forming a first metallic film and a second metallic film, and the performing the first treatment includes exposing the second metallic film to oxidizing gas.

12. The method according to claim 1, wherein the forming the film includes forming a first metallic film and a second metallic film, and the performing the first treatment includes providing oxygen gas to the second metallic film, the oxygen gas being introduced in an atmosphere achieved by ionizing or forming plasma of a gas including at least one selected from the group consisting of argon, xenon, helium, neon and krypton.

13. The method according to claim 1, wherein
the forming the film includes forming a first metallic film and a second metallic film, and
the performing first treatment includes:
performing a pretreatment of irradiating the second metallic film with a gas ionized or formed into plasma, the gas including at least one selected from the group consisting of argon, xenon, helium, neon and krypton; and
providing the oxygen gas to the second metallic film submitted to the pretreatment, the oxygen gas being introduced in an atmosphere achieved by ionizing or forming plasma of a gas including at least one selected from the group consisting of argon, xenon, helium, neon and krypton.

14. The method according to claim 13, wherein the first metallic film includes at least one selected from the group consisting of Cu, Au, Ag and Al, and the second metallic film includes at least one selected from the group consisting Al, Si, Mg, Ti, Hf, Zr, Cr, Mo, Nb and W.

15. The method according to claim 5, wherein a high frequency bias configured to generate the rare gas ions or the rare gas plasma in the third treatment has a power from 5 W to 120 W inclusive.

16. The method according to claim 5, wherein an irradiation time of the rare gas ions or the rare gas plasma in the third treatment is from 5 seconds to 5 minutes inclusive.

17. A magnetic recording and reproducing apparatus comprising:
- a magnetic head assembly including a suspension, a the magneto-resistance effect element being mounted on one end of the suspension, and an actuator arm connected to other end of the suspension; and
- a magnetic recording medium, information being recorded in the magnetic recording medium by using the magneto-resistance effect element,
- the magneto-resistance effect element having a first magnetic layer including a ferromagnetic material, a second magnetic layer including a ferromagnetic material and a spacer layer provided between the first magnetic layer and the second magnetic layer, the spacer layer having an insulating layer and a conductive portion penetrating through the insulating layer,
- the magneto-resistance effect device being manufactured by a method including:
- forming a film to be a base material of the spacer layer;
- performing a first treatment using a gas including at least one of oxygen molecules, oxygen atoms, oxygen ions, oxygen plasma and oxygen radicals on the film; and
- performing a second treatment using a gas including at least one of nitrogen ions, nitrogen atoms, nitrogen plasma, and nitrogen radicals on the film submitted to the first treatment.

\* \* \* \* \*